United States Patent
Mueller et al.

(10) Patent No.: US 7,858,408 B2
(45) Date of Patent: Dec. 28, 2010

(54) LED WITH PHOSPHOR TILE AND OVERMOLDED PHOSPHOR IN LENS

(75) Inventors: Gerd O. Mueller, San Jose, CA (US); Regina Mueller-Mach, San Jose, CA (US); Grigoriy Basin, San Francisco, CA (US); Robert Scott West, Morgan Hill, CA (US); Paul S. Martin, Pleasanton, CA (US); Tze-Sen Lim, Bayan Lepas (MY); Stefan Eberle, Mountain View, CA (US)

(73) Assignees: Koninklijke Philips Electronics N.V., Eindhoven (NL); Philips Lumileds Lighting Company, LLC, San Jose, CA (US)

( * ) Notice: Subject to any disclaimer, the term of this patent is extended or adjusted under 35 U.S.C. 154(b) by 889 days.

(21) Appl. No.: 11/679,143

(22) Filed: Feb. 26, 2007

(65) Prior Publication Data

US 2008/0048200 A1   Feb. 28, 2008

Related U.S. Application Data

(63) Continuation-in-part of application No. 11/093,961, filed on Mar. 29, 2005, now Pat. No. 7,352,011, which is a continuation-in-part of application No. 11/069,418, filed on Feb. 28, 2005, now Pat. No. 7,344,902, which is a continuation-in-part of application No. 10/990,208, filed on Nov. 15, 2004, now Pat. No. 7,452,737.

(51) Int. Cl.
   *H01L 33/50* (2010.01)
   *H01L 21/56* (2010.01)

(52) U.S. Cl. .......... 438/27; 257/E21.504; 257/E33.059; 257/E33.061

(58) Field of Classification Search ................... 438/26, 438/27, 28, 29; 257/E21.504, E33.059, E33.061
   See application file for complete search history.

(56) References Cited

U.S. PATENT DOCUMENTS

5,435,953 A   7/1995   Osada et al.

(Continued)

FOREIGN PATENT DOCUMENTS

| JP | 0519705 | 1/1993 |
|---|---|---|
| JP | H519705 | 1/1993 |
| WO | 2005067068 A1 | 7/2005 |
| WO | 2006103582 A1 | 10/2006 |

OTHER PUBLICATIONS

"Side-Emitting Optic," Carclo Precision Optics data sheet, downloaded from www.carclo-optics.com, 2 pages.

(Continued)

*Primary Examiner*—Sue Purvis
*Assistant Examiner*—W. Wendy Kuo

(57) ABSTRACT

Overmolded lenses and certain fabrication techniques are described for LED structures. In one embodiment, thin YAG phosphor plates are formed and affixed over blue LEDs mounted on a submount wafer. A clear lens is then molded over each LED structure during a single molding process. The LEDs are then separated from the wafer. The molded lens may include red phosphor to generate a warmer white light. In another embodiment, the phosphor plates are first temporarily mounted on a backplate, and a lens containing a red phosphor is molded over the phosphor plates. The plates with overmolded lenses are removed from the backplate and affixed to the top of an energizing LED. A clear lens is then molded over each LED structure. The shape of the molded phosphor-loaded lenses may be designed to improve the color vs. angle uniformity. Multiple dies may be encapsulated by a single lens. In another embodiment, a prefabricated collimating lens is glued to the flat top of an overmolded lens.

11 Claims, 22 Drawing Sheets

U.S. PATENT DOCUMENTS

| | | | |
|---|---|---|---|
| 5,507,633 | A | 4/1996 | Osada et al. |
| 5,603,879 | A | 2/1997 | Osada et al. |
| 5,753,538 | A | 5/1998 | Kuno et al. |
| 5,834,035 | A | 11/1998 | Osada et al. |
| 6,274,399 | B1 | 8/2001 | Kern et al. |
| 6,274,890 | B1 * | 8/2001 | Oshio et al. ............ 257/98 |
| 6,274,924 | B1 | 8/2001 | Carey et al. |
| 6,576,488 | B2 | 6/2003 | Collins, III et al. |
| 6,649,440 | B1 | 11/2003 | Krames et al. |
| 6,653,157 | B2 | 11/2003 | Kondo |
| 6,682,331 | B1 * | 1/2004 | Peh et al. ............ 425/112 |
| 6,977,188 | B2 | 12/2005 | Takase |
| 7,029,935 | B2 * | 4/2006 | Negley et al. ............ 438/29 |
| 2001/0026011 | A1 | 10/2001 | Roberts et al. |
| 2001/0042865 | A1 | 11/2001 | Oshio et al. |
| 2002/0141006 | A1 | 10/2002 | Pocius et al. |
| 2004/0036081 | A1 | 2/2004 | Okazaki |
| 2004/0070990 | A1 * | 4/2004 | Szypszak ............ 362/555 |
| 2004/0227149 | A1 | 11/2004 | Ibbetson et al. |
| 2005/0024744 | A1 | 2/2005 | Falicoff et al. |
| 2005/0224829 | A1 | 10/2005 | Negley et al. |
| 2005/0225988 | A1 | 10/2005 | Chaves et al. |
| 2005/0269582 | A1 | 12/2005 | Mueller et al. |
| 2006/0006404 | A1 | 1/2006 | Ibbetson et al. |
| 2006/0091418 | A1 | 5/2006 | Chew |
| 2006/0102914 | A1 | 5/2006 | Smits et al. |
| 2006/0105484 | A1 | 5/2006 | Basin et al. |
| 2006/0105485 | A1 | 5/2006 | Basin et al. |
| 2006/0226759 | A1 | 10/2006 | Masuda et al. |

OTHER PUBLICATIONS

"FFT Flow Free Thin Molding System," Towa Corporation ad, 2 pages.

ISR PCT/IB2008/050692; International Filing date: Feb. 26, 2008 and Written Opinion. pp. 1-22.

* cited by examiner

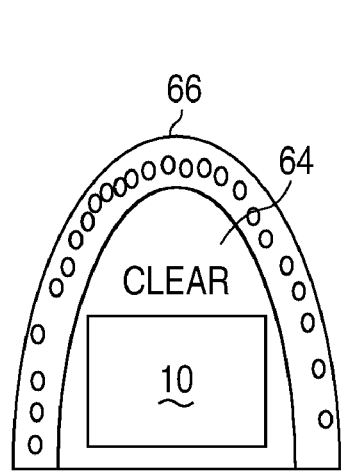
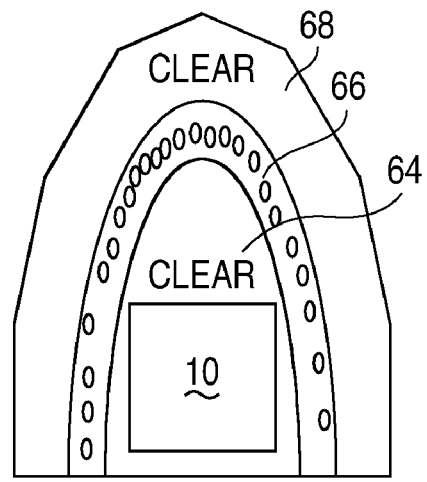
Fig. 9    Fig. 10
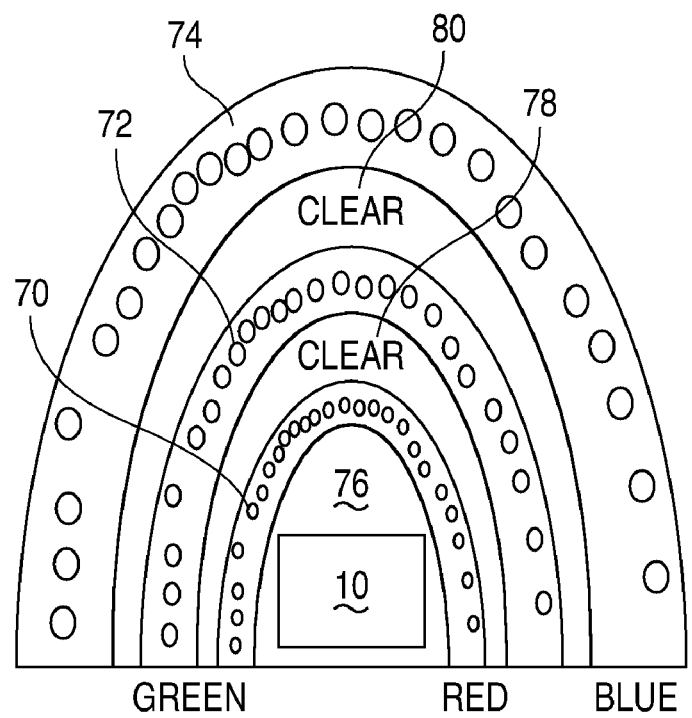
Fig. 11

LED WITH PHOSPHOR TILE AND OVERMOLDED PHOSPHOR IN LENS

CROSS-REFERENCE TO RELATED APPLICATIONS

This is a continuation-in-part (CIP) of U.S. application Ser. No. 11/093,961, filed Mar. 29, 2005, entitled "Wide Emitting Lens for LED Useful for Backlighting," by Willem Smits, Grigoriy Basin, et al., which is a CIP of U.S. application Ser. No. 11/069,418, filed Feb. 28, 2005, by Grigoriy Basin et al., entitled "Overmolded Lens Over LED Die," which is a CIP of U.S. application Ser. No. 10/990,208, filed Nov. 15, 2004, by Grigoriy Basin et al., entitled "Molded Lens Over LED Die," all incorporated herein by reference.

FIELD OF THE INVENTION

This invention relates to light emitting diodes (LEDs) and, in particular, to certain lens designs and a technique for forming a lens over an LED die.

BACKGROUND

LED dies typically emit light in a lambertian pattern. It is common to use a lens over the LED die to narrow the beam or to make a side-emission pattern. A common type of lens for a surface mounted LED is preformed molded plastic, which is bonded to a package in which the LED die is mounted. One such lens is shown in U.S. Pat. No. 6,274,924, assigned to Philips Lumileds Lighting Company and incorporated herein by reference.

SUMMARY

A technique for forming a molded lens for surface mounted LEDs is described herein along with various designs of lenses. Also described are various techniques for providing color converting phosphors within the lens.

In one method for forming lenses, one LED die or multiple LED dice are mounted on a support structure. The support structure may be a ceramic substrate, a silicon substrate, or other type of support structure with the LED dice electrically connected to metal pads on the support structure. The support structure may be a submount, which is mounted on a circuit board or a heat sink in a package.

A mold has indentations in it corresponding to the positions of the LED dice on the support structure. The indentations are filled with a liquid, optically transparent material, such as silicone, which when cured forms a hardened lens material. The shape of the indentations will be the shape of the lens. The mold and the LED dice/support structure are brought together so that each LED die resides within the liquid lens material in an associated indentation.

The mold is then heated to cure (harden) the lens material. The mold and the support structure are then separated, leaving a complete lens over each LED die. This general process will be referred to as overmolding. In contrast to injection molding techniques where the liquid material is injected at high pressure after the empty mold is encased around the object to be encapsulated, the present invention uses no such injection and the LED and any wire bonds are not stressed by the molding process. Also, there is very little waste of the lens material. Further, there are no conduits between mold indentions, as would be required for injection molding.

The overmolding process may be repeated with different molds to create overlapping shells of lenses. The lenses may contain any combinations of phosphors to convert the LED light to any color, including white.

In one embodiment, thin ceramic phosphor plates are formed by sintering phosphor grains under heat and pressure or by drying a slurry of phosphor grains. Each plate has a surface approximately the size of the top surface of the energizing LED, such as a blue LED. The phosphor may be YAG phosphor, where the combination of the blue light from the LED and the green-yellow light from the YAG phosphor produces white light. The plates may be affixed over LEDs mounted on a submount wafer, and a clear lens is then molded over each LED structure. The submount is then singulated to separate the LED structures.

In another embodiment, the molded lens over the LED and YAG phosphor plate includes red phosphor to generate a warmer white light.

In another embodiment, the phosphor plates are first temporarily mounted on a backplate, and a lens containing a red phosphor is molded over the phosphor plates. The plates with overmolded lenses are removed from the backplate and affixed to the top of an energizing LED. A clear lens is then molded over each LED structure.

Since the phosphor plate is flat, the color temperature becomes hotter (more blue) as the viewing angle approaches an angle normal to the surface of the LED/phosphor. To compensate for this color vs. angle non-uniformity, the shape of the mold containing the red phosphor is defined so that the color temperature is more uniform as the viewing angle changes. The shape of the mold is therefore dependent on the particular LED and phosphor plate used.

In one embodiment, the cured silicone used to form the outer lens by overmolding is much harder than any inner lens formed by overmolding. The softer inner lens does not put stress on the delicate LED when the lens is being formed or when the LED generates heat, while the hard outer lens protects against the outside elements and remains clean.

In another embodiment, multiple LEDs or an LED and another chip, such as for electrostatic discharge (ESD) protection, are encapsulated by a single overmolded lens, where the shape of the lens is based on the particular chips being encapsulated.

In another embodiment, an molded lens is formed over an LED, where the lens may be clear or phosphor loaded. The top of the lens has a flat portion. A prefabricated collimating lens, such as a Fresnel lens, approximately the same size as the LED, is then affixed to the flat portion of the overmolded lens. Such a small collimated light source is particularly useful as a cell phone camera flash.

In another embodiment, a soft silicone gel is used as an underfill between the LED and the submount to fill in any voids. The underfill may optionally coat the sides of the LED. The resulting structure is then overmolded with a hard lens. The underfill helps support the LED die during processing and operation, couples heat to the submount, and reduces stress between the LED die and the hard outer lens.

Many other embodiments of lenses and applications are described.

BRIEF DESCRIPTION OF THE DRAWINGS

FIGS. 7, 8, 9, 10, and 11 are cross-sectional views of an LED die with different lenses formed over it.

Elements labeled with the same numeral in the various figures may be the same or equivalent.

DETAILED DESCRIPTION

As a preliminary matter, a conventional LED is formed on a growth substrate. In the example used, the LED is a GaN-based LED, such as an AlInGaN LED, for producing blue or UV light. Typically, a relatively thick n-type GaN layer is grown on a sapphire growth substrate using conventional techniques. The relatively thick GaN layer typically includes a low temperature nucleation layer and one or more additional layers so as to provide a low-defect lattice structure for the n-type cladding layer and active layer. One or more n-type cladding layers are then formed over the thick n-type layer, followed by an active layer, one or more p-type cladding layers, and a p-type contact layer (for metallization).

Various techniques are used to gain electrical access to the n-layers. In a flip-chip example, portions of the p-layers and active layer are etched away to expose an n-layer for metallization. In this way the p contact and n contact are on the same side of the chip and can be directly electrically attached to the package (or submount) contact pads. Current from the n-metal contact initially spreads laterally through the n-layer. In contrast, in a vertical injection (non-flip-chip) LED, an n-contact is formed on one side of the chip, and a p-contact is formed on the other side of the chip. Electrical contact to one of the p or n-contacts is typically made with a wire or a metal bridge, and the other contact is directly bonded to a package (or submount) contact pad. A flip-chip LED is used in the examples of FIGS. 1-3 for simplicity.

Examples of forming LEDs are described in U.S. Pat. Nos. 6,649,440 and 6,274,399, both assigned to Philips Lumileds Lighting Company and incorporated by reference.

Optionally, a conductive substrate is bonded to the LED layers (typically to the p-layers) and the sapphire substrate is removed. One or more LED dice may be bonded to metal pads on a submount, with the conductive substrate directly bonded to the metal pads, to be described in greater detail with respect to FIGS. 5 and 6. Electrodes of one or more submounts may be bonded to a printed circuit board, which contains metal leads for connection to other LEDs or to a power supply. The circuit board may interconnect various LEDs in series and/or parallel.

The particular LEDs formed and whether or not they are mounted on a submount is not important for purposes of understanding the invention.

Figure 1:
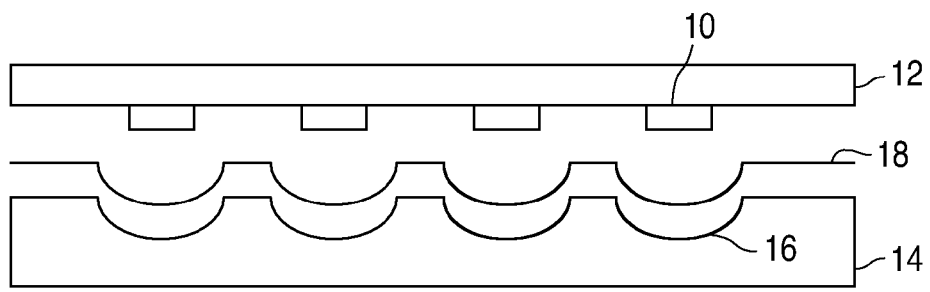
FIG. 1 is a side view of four LED dice mounted on a support structure, such as a submount, and a mold for forming a lens around each LED die.

FIG. 1 is a side view of four LED dice 10 mounted on a support structure 12. The support structure may be a submount (e.g., ceramic or silicon with metal leads), a metal heat sink, a printed circuit board, or any other structure. In the present example, the support structure 12 is a ceramic submount with metal pads/leads.

A mold 14 has indentations 16 corresponding to the desired shape of a lens over each LED die 10. Mold 14 is preferably formed of a metal. A very thin non-stick film 18, having the general shape of mold 14, is placed or formed over mold 14. Film 18 is of a well known conventional material that prevents the sticking of silicone to metal.

Film 18 is not needed if the lens material does not stick to the mold. This may be accomplished by using a non-stick mold coating, using a non-stick mold material, or using a mold process that results in a non-stick interface. Such processes may involve selecting certain process temperatures to obtain the minimum stick. By not using film 18, more complex lenses can be formed.

Figure 2:
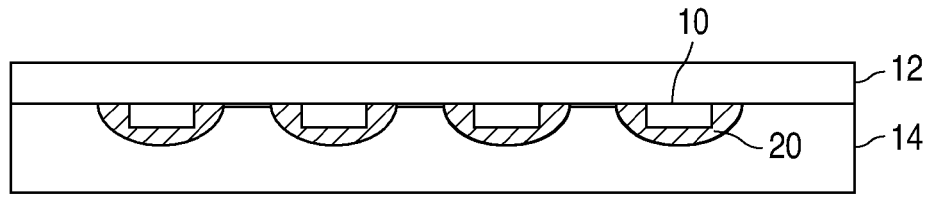
FIG. 2 is a side view of the LED dice being inserted into indentations in the mold filled with a liquid lens material.

In FIG. 2, the mold indentions 16 have been filled with a heat-curable liquid lens material 20. The lens material 20 may be any suitable optically transparent material such as silicone, an epoxy, or a hybrid silicone/epoxy. A hybrid may be used to achieve a matching coefficient of thermal expansion (CTE). Silicone and epoxy have a sufficiently high index of refraction (greater than 1.4) to greatly improve the light extraction from an AlInGaN or AlInGaP LED as well as act as a lens. One type of silicone has an index of refraction of 1.76.

A vacuum seal is created between the periphery of the support structure 12 and mold 14, and the two pieces are pressed against each other so that each LED die 10 is inserted into the liquid lens material 20 and the lens material 20 is under compression.

The mold is then heated to about 150 degrees centigrade (or other suitable temperature) for a time to harden the lens material 20.

The support structure 12 is then separated from mold 14. Film 18 causes the resulting hardened lens to be easily released from mold 14. Film 18 is then removed.

In another embodiment, the LED dice 10 in FIG. 1 may be first covered with a material, such as silicone or phosphor particles in a binder. The mold indentations 16 are filled with another material. When the dice are then placed in the mold, the mold material is shaped over the covering material.

Figure 3:
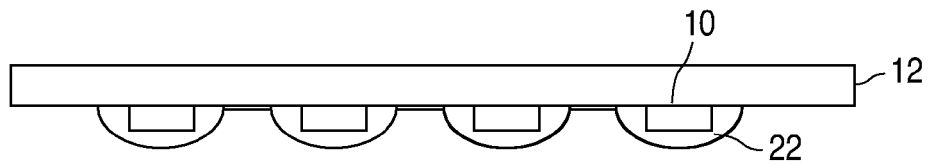
FIG. 3 is a side view of the LED dice removed from the mold after the liquid has been cured, resulting in a lens encapsulating each LED die.

FIG. 3 illustrates the resulting structure with a molded lens 22 over each LED die 10. In one embodiment, the molded lens is between 1 mm and 5 mm in diameter. The lens 22 may be any size or shape.

Figure 4:
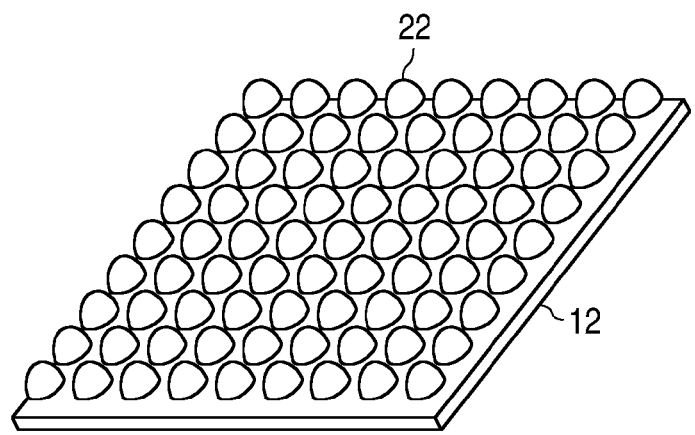
FIG. 4 is a perspective view of an array of LED dice on a submount or circuit board with a molded lens formed over each LED die.

FIG. 4 is a perspective view of a resulting structure where the support structure 12 supports an array of LED dice, each having a molded lens 22. The mold used would have a corresponding array of indentations. If the support structure 12 were a ceramic or silicon submount, each LED (with its underlying submount portion) can be separated by sawing or breaking the submount 12 to form individual LED dice. Alternatively, the support structure 12 may be separated/diced to support subgroups of LEDs or may be used without being separated/diced.

The lens 22 not only improves the light extraction from the LED die and refracts the light to create a desired emission pattern, but the lens also encapsulates the LED die to protect the die from contaminants, add mechanical strength, and protect any wire bonds.

Figure 5:
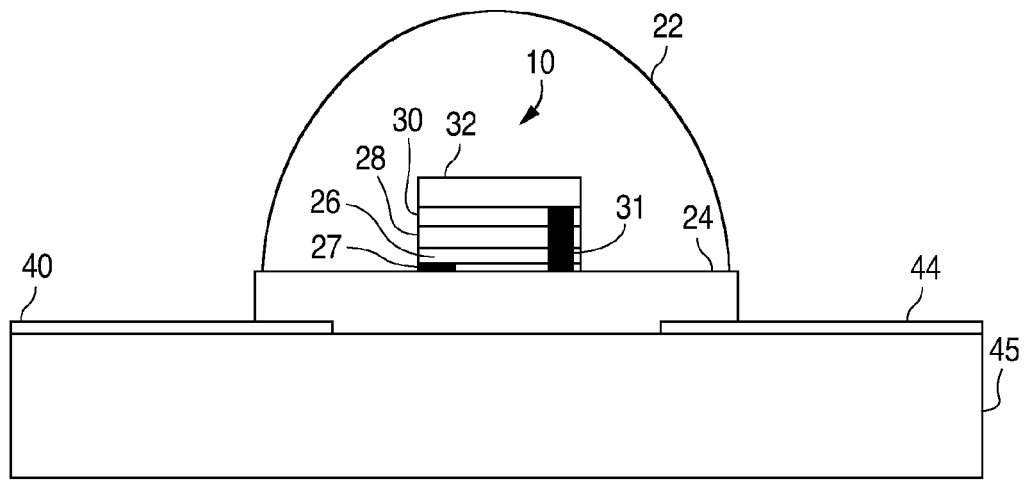
FIG. 5 is a close-up side view of a flip-chip LED die mounted on a submount, which is, in turn, mounted on a circuit board, and where a molded lens is formed over the LED die.

FIG. 5 is a simplified close-up view of one embodiment of a single flip-chip LED die 10 on a submount 24 formed of any suitable material, such as a ceramic or silicon. In one embodiment, submount 24 acted as the support structure 12 in FIGS. 1-4, and the die/submount of FIG. 5 was separated from the structure of FIG. 4 by sawing. The LED die 10 of FIG. 5 has a bottom p-contact layer 26, a p-metal contact 27, p-type layers 28, a light emitting active layer 30, n-type layers 32, and an n-metal contact 31 contacting the n-type layers 32. Metal pads on submount 24 are directly metal-bonded to contacts 27 and 31. Vias through submount 24 terminate in metal pads on the bottom surface of submount 24, which are bonded to the metal leads 40 and 44 on a circuit board 45. The metal leads 40 and 44 are connected to other LEDs or to a power supply. Circuit board 45 may be a metal plate (e.g., aluminum) with the metal leads 40 and 44 overlying an insulating layer. The molded lens 22, formed using the technique of FIGS. 1-3, encapsulates the LED die 10.

The LED die 10 in FIG. 5 may also be a non-flip-chip die, with a wire connecting the top n-layers 32 to a metal pad on the submount 24. The lens 22 may encapsulate the wire.

Figure 6:
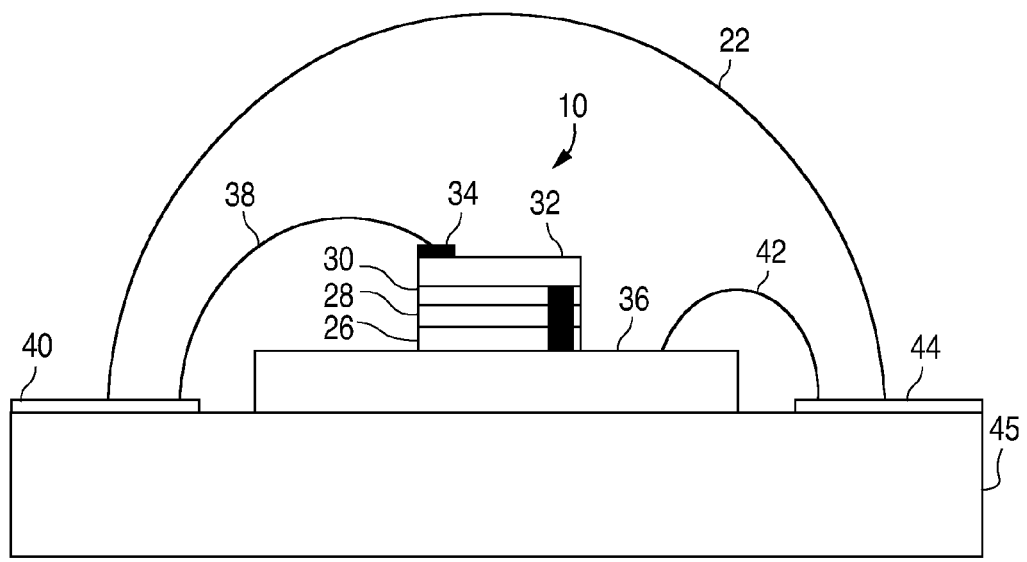
FIG. 6 is a close-up side view of a non-flip-chip LED die mounted on a submount, which is, in turn, mounted on a circuit board, where wires electrically connect n and p metal on the LED die to leads on the circuit board, and where a molded lens is formed over the LED die.

In one embodiment, the circuit board 45 itself may be the support structure 12 of FIGS. 1-3. Such an embodiment is shown in FIG. 6. FIG. 6 is a simplified close-up view of a non-flip-chip LED die 10 having a top n-metal contact 34 connected to a metal lead 40 on circuit board 45 by a wire 38. The LED die 10 is mounted on a submount 36, which in the example of FIG. 6 is a metal slab. A wire 42 electrically connects the p-layers 26/28 to a metal lead 44 on circuit board 45. The lens 22 is shown completely encapsulating the wires and submount 36; however, in other embodiments the entire submount or the entire wire need not be encapsulated.

A common prior art encapsulation method is to spin on a protective coating. However, that encapsulation process is inappropriate for adding a phosphor coating to the LED die since the thickness of the encapsulant over the LED die is uneven. Also, such encapsulation methods do not form a lens. A common technique for providing a phosphor over the LED die is to fill a reflective cup surrounding the LED die with a silicone/phosphor composition. However, that technique forms a phosphor layer with varying thicknesses and does not form a suitable lens. If a lens is desired, additional processes still have to create a plastic molded lens and affix it over the LED die.

FIGS. 7-11 illustrate various lenses that may be formed using the above-described techniques.

Figure 7:
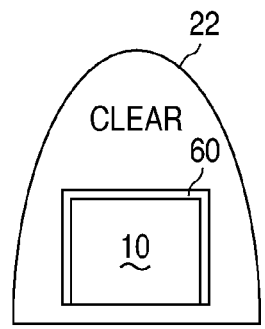
Figure 8:
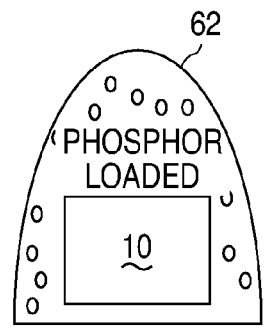

FIG. 7 illustrates an LED die 10 that has been coated with a phosphor 60 using any suitable method. One such method is by electrophoresis, described in U.S. Pat. No. 6,576,488, assigned to Philips Lumileds Lighting Company and incorporated herein by reference. Suitable phosphors are well known. A lens 22 is formed using the techniques described above. The phosphor 60 is energized by the LED emission (e.g., blue or UV light) and emits light of a different wavelength, such as green, yellow, or red. The phosphor emission alone or in conjunction with the LED emission may produce white light.

Processes for coating an LED with a phosphor are time-consuming. To eliminate the process for coating the LED die with a phosphor, the phosphor powder may be mixed with the liquid silicone so as to become embedded in the lens 62, shown in FIG. 8.

As shown in FIG. 9, to provide a carefully controlled thickness of phosphor material over the LED die, an inner lens 64 is formed using the above-described techniques, and a separate molding step (using a mold with deeper and wider indentations) is used to form an outer phosphor/silicone shell 66 of any thickness directly over the inner lens 64.

FIG. 10 illustrates an outer lens 68 that may be formed over the phosphor/silicone shell 66 using another mold to further shape the beam.

FIG. 11 illustrates shells 70, 72, and 74 of red, green, and blue-emission phosphors, respectively, overlying clear silicone shells 76, 78, and 80. In this case, LED die 10 emits UV light, and the combination of the red, green, and blue emissions produces a white light. All shells are produced with the above-described methods.

Figure 12:
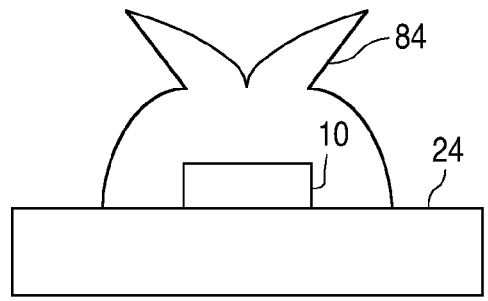
FIG. 12 is a cross-sectional view of a side-emitting lens molded onto the LED die using the inventive techniques.

Many other shapes of lenses can be formed using the molding technique described above. FIG. 12 is a cross-sectional view of LED 10, submount 24, and a molded side-emitting lens 84. In one embodiment, lens 84 is formed of a very flexible material, such as silicone, which flexes as it is removed from the mold. When the lens is not a simple shape, the release film 18 (FIG. 1) will typically not be used.

Figure 13:
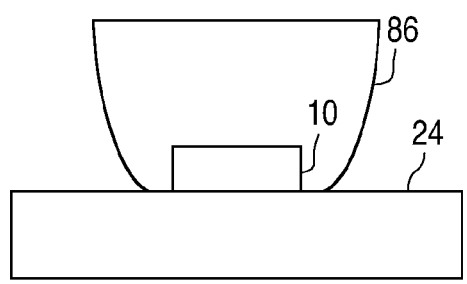
FIG. 13 is a cross-sectional view of a collimating lens molded onto the LED die using the inventive techniques.

FIG. 13 is a cross-sectional view of LED 10, submount 24, and a molded collimating lens 86. The lens 86 can be produced using a deformable mold or by using a soft lens material that compresses when being pulled from the mold and expands to its molded shape after being released from the mold.

Figure 14:
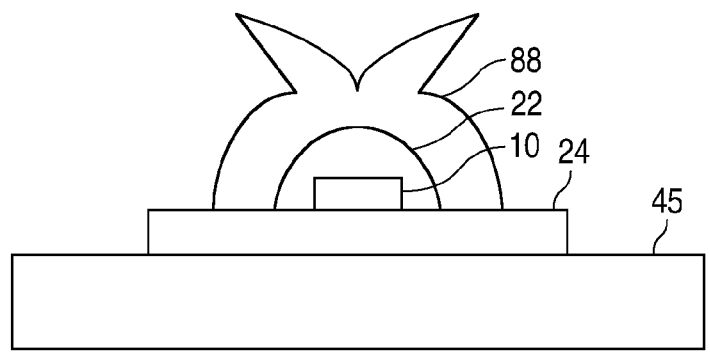
FIG. 14 is a cross-sectional view of a preformed side-emitting lens affixed over a lambertian lens that has been molded onto the LED die using the inventive techniques.

FIG. 14 illustrates how a preformed lens 88 can be affixed over a molded lambertian lens 22. In the example of FIG. 14, lens 22 is formed in the previously described manner. Lens 22 serves to encapsulate and protect LED 10 from contaminants. A preformed side-emitting lens 88 is then affixed over lens 22 using a UV curable adhesive or a mechanical clamp. This lens-forming technique has advantages over conventional techniques. In a conventional technique, a preformed lens (e.g., a side emitting lens) is adhesively affixed over the LED die, and any gaps are filled in by injecting silicone. The conventional process is difficult to perform due to, among other reasons, carefully positioning the separated die/submount for the lens placement and gap-filling steps. Using the inventive technique of FIG. 14, a large array of LEDs (FIG. 4) can be encapsulated simultaneously by forming a molded lens over each. Then, a preformed lens 88 can be affixed over each molded lens 22 while the LEDs are still in the array (FIG. 4) or after being separated.

Additionally, the molded lens can be made very small (e.g., 1-2mm diameter), unlike a conventional lens. Thus, a very small, fully encapsulated LED can be formed. Such LEDs can be made to have a very low profile, which is beneficial for certain applications.

FIG. 14 also shows a circuit board 45 on which submount 24 is mounted. This circuit board 45 may have mounted on it an array of LEDs/submounts 24.

Figure 15:
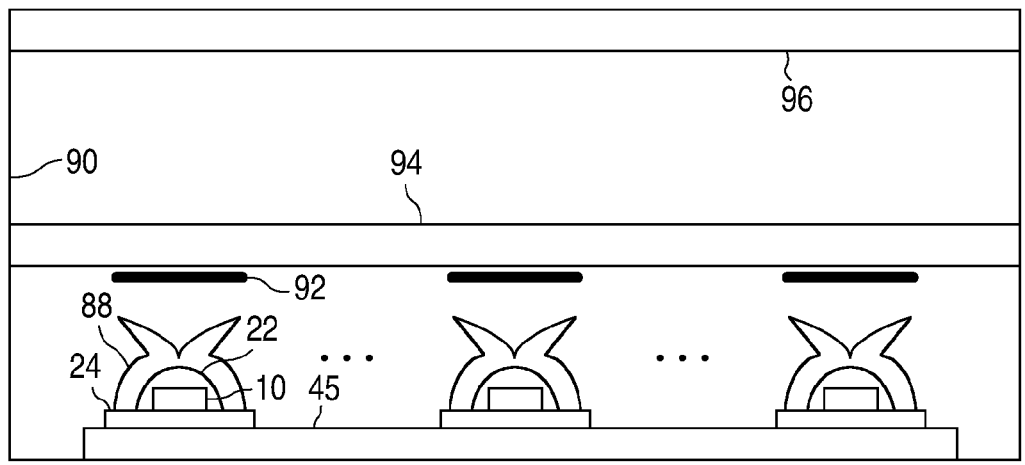
FIG. 15 is a cross-sectional view of a backlight for a liquid crystal display or other type of display using the LED and side-emitting lens of FIG. 14.

FIG. 15 is a cross-sectional view of a backlight for a liquid crystal display (LCD) or other display that uses a backlight. Common uses are for televisions, monitors, cellular phones, etc. The LEDs may be red, green, and blue to create white light. The LEDs form a two-dimensional array. In the example shown, each LED structure is that shown in FIG. 14, but any suitable lens may be used. The bottom and sidewalls 90 of the backlight box are preferably coated with a white reflectively-diffusing material. Directly above each LED is a white diffuser dot 92 to prevent spots of light from being emitted by the backlight directly above each LED. The dots 92 are supported by a transparent or diffusing PMMA sheet 94. The light emitted by the side-emitting lenses 88 is mixed in the lower portion of the backlight, then further mixed in the upper portion of the backlight before exiting the upper diffuser 96. Linear arrays of LEDs may be mounted on narrow circuit boards 45.

Figure 16:
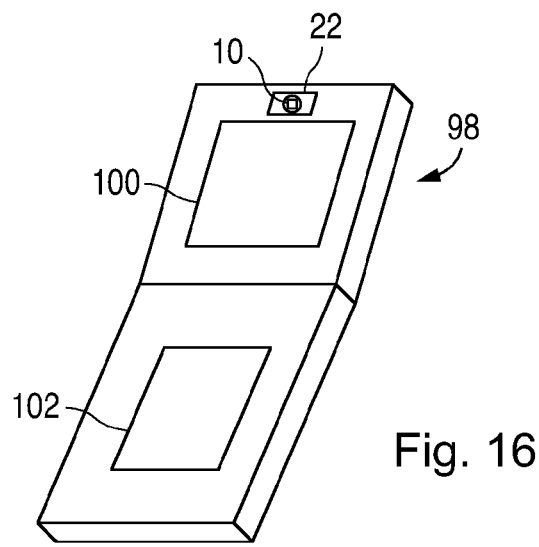
FIG. 16 is a perspective view of a cell phone with a camera that uses as a flash an LED with a molded lens.

FIG. 16 illustrates an LED 10 with a molded lens 22 being used as a flash in a camera. The camera in FIG. 16 is part of a cellular telephone 98. The cellular telephone 98 includes a color screen 100 (which may have a backlight using the LEDs described herein) and a keypad 102.

As discussed with respect to FIG. 10, an outer lens may be formed over the inner shell to further shape the beam. Different shell materials may be used, depending on the requirements of the various shells. FIGS. 17-30 illustrate examples of various lenses and materials that may be used in conjunction with the overmolding process.

Figure 17:
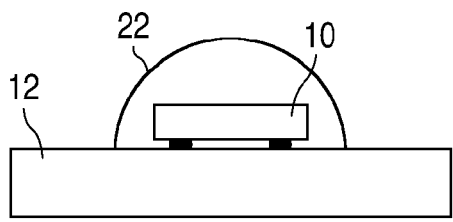
FIGS. 17 and 18 are cross-sectional views of two types of molded lenses. All lenses shown are symmetrical about the center axis, although the invention may apply to non-symmetrical lenses as well.
Figure 18:
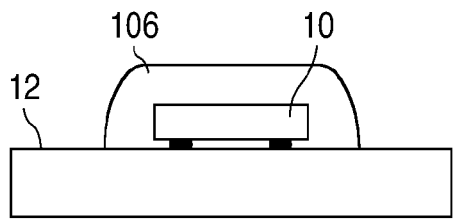

FIGS. 17 and 18 illustrate two shapes of molded lenses for an inner shell formed using the molding techniques described above. Many LEDs 10 may be mounted on the same support structure 12. The support structure 12 may be a ceramic or silicon submount with metal traces and contact pads, as previously described. Any number of LEDs may be mounted on the same support structure 12, and all LEDs on the same support structure 12 would typically be processed in an identical manner, although not necessarily. For example, if the support structure were large and the light pattern for the entire LED array were specified, each LED lens may differ to provide the specified overall light pattern.

An underfill material may be injected to fill any gap between the bottom of the LED die 10 and the support substrate 12 to prevent any air gaps under the LED and to improve heat conduction, among other things.

FIG. 17 has been described above with respect to FIGS. 3-6, where the inner molded lens 22 is generally hemispherical for a lambertian radiation pattern. The inner molded lens 106 in FIG. 18 is generally rectangular with rounded edges. Depending on the radiation pattern to be provided by an outer lens, one of the inner molded lenses 22 or 106 may be more suitable. Other shapes of inner molded lenses may also be suitable. The top down view of each lens will generally be circular.

Figure 19:
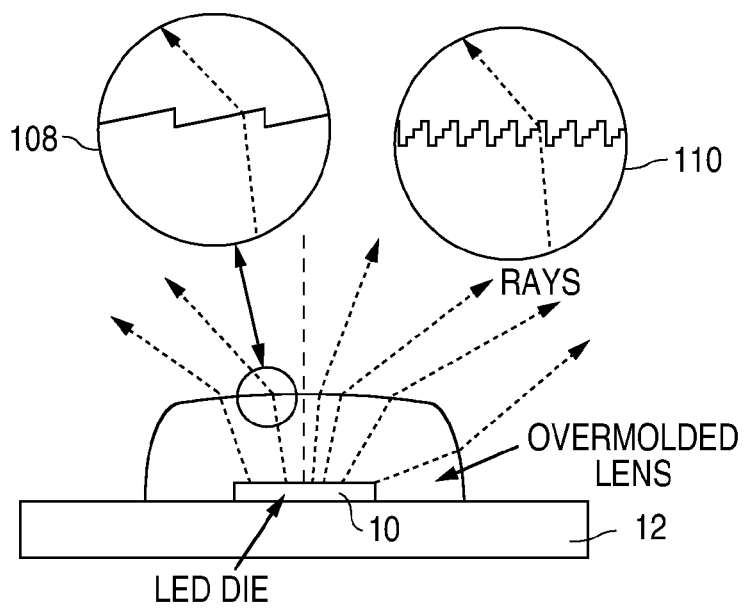
FIGS. 19-22 illustrate surface features on an inner lens or an outer shell lens for obtaining a desired emission pattern.
Figure 20:
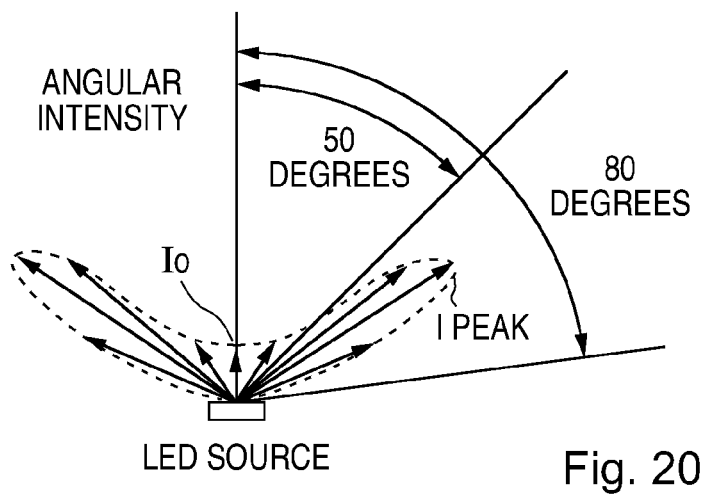

FIG. 19 illustrates the structure of FIG. 18 with the lens outer surface having a pattern that refracts light to achieve a desired radiation pattern. The outer surface pattern may be directly formed in the inner molded lens (by the mold itself), or the outer surface pattern may be formed in an outer lens that is overmolded onto the inner molded lens or is affixed to it by an adhesive (e.g., silicone, epoxy, etc.). Pattern 108 is a diffraction grating, while pattern 110 uses binary steps to refract the light. In the examples, the pattern forms a generally side-emitting lens with the radiation pattern shown in FIG. 20. In FIG. 20, the peak intensity occurs within 50-80 degrees and is significantly greater than the intensity at 0 degrees.

The requirements for the inner lens are generally different from the requirements for the outer lens. For example, the inner lens should have good adhesion to the support structure, not yellow or become more opaque over time, have a high index of refraction (greater than 1.4), not break or stress any wires to the LED, withstand the high LED temperatures, and have a compatible thermal coefficient. The inner lens should be non-rigid (e.g., silicone) to not provide stress on the LED or any wires. In contrast, the outer lens material generally only needs to be able to be patterned with the desired pattern and adhere to the inner lens. The outer lens may overmolded or may be preformed and adhesively affixed to the inner lens.

The material for the outer lens may be UV curable, while the material for the inner lens may be thermally cured. Thermal curing takes longer than UV curing.

Generally, the range of hardness for the inner lens material is Shore 00 5-90, while the range of hardness for the outer shell(s) is Shore A 30 or more.

Figure 21:
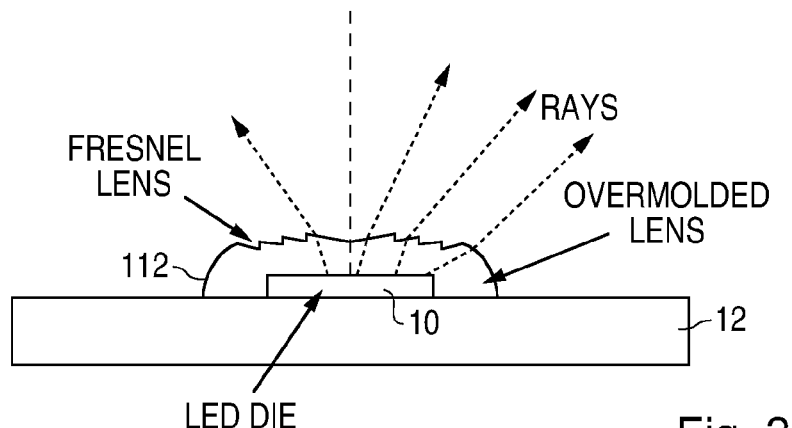

FIG. 21 illustrates a Fresnel lens pattern 112 formed on the outer surface of the lens for creating a generally side-emitting light pattern similar to that of FIG. 20. The outer surface may be the outer surface of the inner molded lens or the outer surface of an outer shell, as described with respect to FIG. 19. This applies to all patterns described herein.

Figure 22:
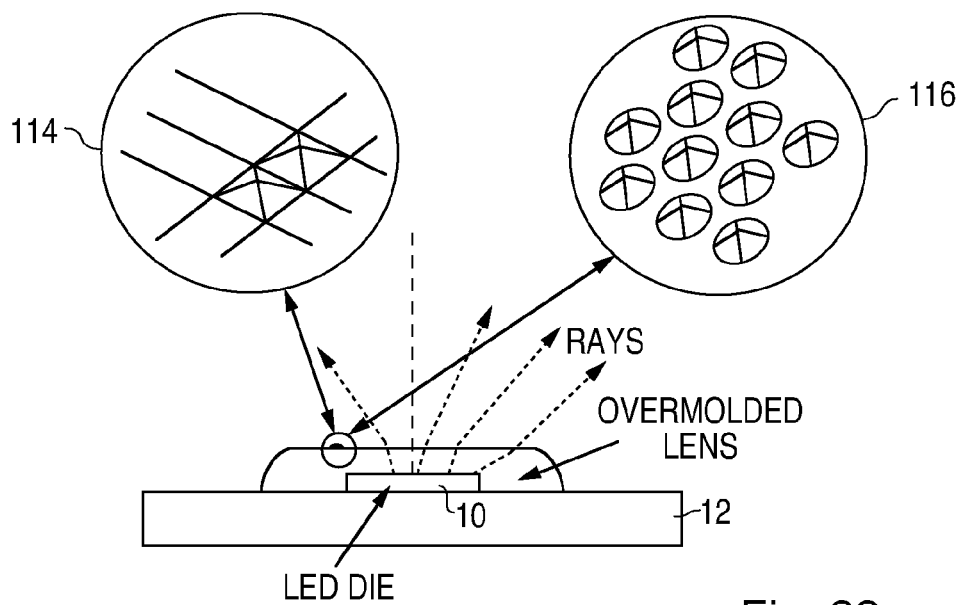

FIG. 22 illustrates pyramid 114 or cone shaped 116 patterns on the outer lens surface to create a collimating light pattern or another light pattern.

Figure 23:
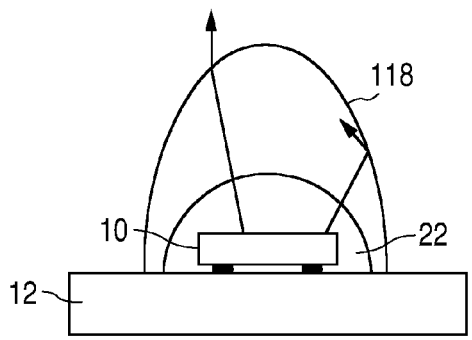
FIG. 23 illustrates the use of a high domed lens for a collimated emission pattern.

FIG. 23 illustrates a high dome outer lens 118 for creating a collimating pattern.

The surface patterns of FIGS. 19 and 21-23 may be configured (e.g., by changing the surface angles) to create any light pattern. Holographic structures, TIR, and other patterns may be formed. Collimating light patterns are typically used for rear projection TVs, while side-emitting light patterns are typically used for backlighting LCD screens.

Figure 24:
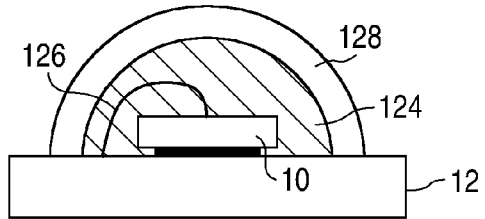
FIGS. 24 and 25 illustrate the use of a hard outer lens and a soft inner lens to limit the stress on a wire bond.

FIG. 24 illustrates the use of a soft material, such as a silicone gel, as the inner molded lens 124 so as to not stress the wire 126 bonded to the LED 10. The gel is typically UV cured. The outer lens 128 may be molded or preformed and affixed with an adhesive. The outer lens 128 will typically be much harder for durability, resistance to particles, etc. The outer lens 128 may be silicone, epoxy-silicone, epoxy, silicone elastomers, hard rubber, other polymers, or other material. The outer lens may be UV or thermally cured.

Figure 25:
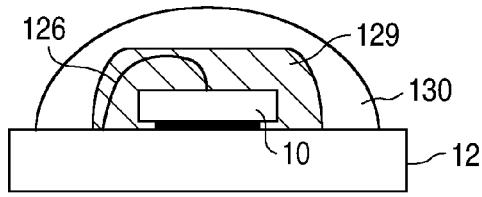

FIG. 25 is similar to FIG. 24 but with a different shaped inner molded lens 129 (like FIG. 18) for a different emission pattern or a lower profile. Lens 129 may be a soft silicone gel. The outer lens 130 will further shape the emission pattern and protect the soft inner lens 129.

The LEDs in all figures may be flip-chips or wire bonded types.

Figure 26:
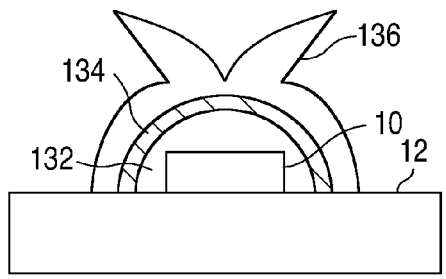
FIGS. 26-28 illustrate the use of an outer lens formed on various types of inner or intermediate lenses for a side-emitting pattern.

FIG. 26 illustrates an LED structure with a soft inner molded lens 132, having the properties needed for the inner lens, a hard intermediate shell 134 to act as an interface layer and for structural stability, and an outer lens 136 for creating a side-emitting light pattern. The outer lens 136 may be soft to facilitate the molding process. Alternatively, the outer lens 136 may be preformed and adhesively affixed to the intermediate shell 134. The use of the intermediate shell 134 makes the choice of the outer lens material essentially independent of the inner lens material.

Figure 27:
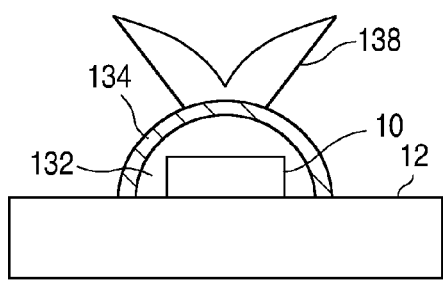

FIG. 27 illustrates how the outer lens 138 may be formed on any portion of the intermediate shell 134 or inner lens 132.

Figure 28:
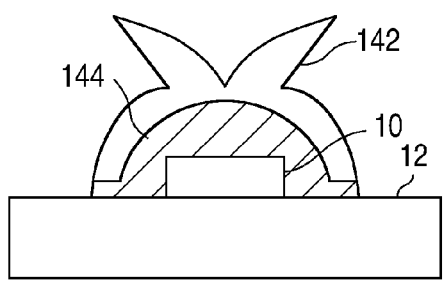

FIG. 28 illustrates the formation of the outer lens 142 directly on the inner lens 144 material.

Figure 29:
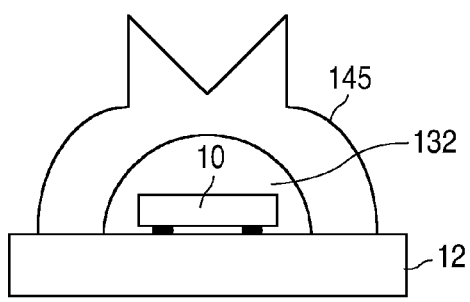
FIG. 29 illustrates another side-emitting molded lens.

FIG. 29 illustrates another shape of side-emitting lens 145 molded over an inner lens 132. Lens 145 may be directly molded over LED die 10 without any inner lens.

Figure 30:
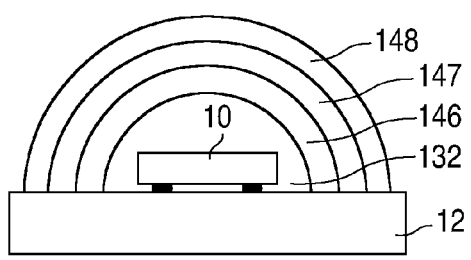
FIG. 30 illustrates the use of molded shells, each containing a different phosphor.

FIG. 30 illustrates an LED where each shell 146, 147, and 148 contains a different phosphor material, such as a red-emitting phosphor, a green-emitting phosphor, and a blue-emitting phosphor. The LED die 10 may emit UV. The gaps between phosphor particles allow the UV to pass through an inner shell to energize the phosphor in an outer shell. Alternatively, only red and green phosphor shells are used, and the LED die 10 emits blue light. The combination of red, green, and blue light create white light. The thickness of the shells, the density of the phosphor particles, and the order of the phosphor colors, among other things, can be adjusted to obtain the desired light. Any shape of lenses may be used.

Figure 31:
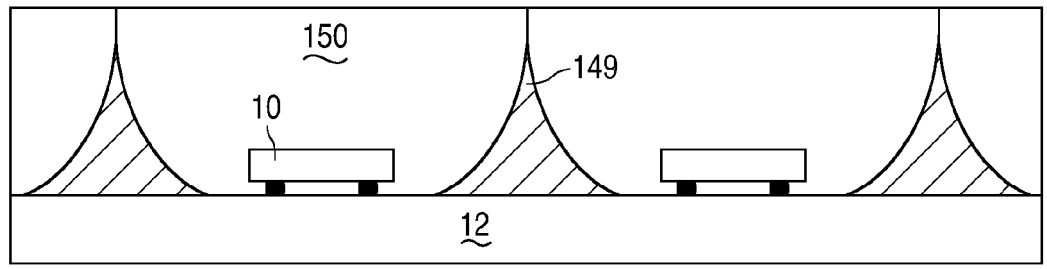
FIG. 31 illustrates forming a mold portion on the support substrate for forming a molded lens.

FIG. 31 illustrates the use of a mold pattern 149 on the support structure 12 itself. A high index material (e.g., a polymer) or a reflective material (e.g., aluminum or silver) is formed by either molding the pattern on the support structure 12, using a method similar to the method shown in FIG. 1, or using a metallization process, or using another suitable process. The mold pattern 149 is then used as a mold for another material forming a lens 150. In one embodiment, the lens 150 material is a liquid (e.g., silicone) that is deposited in the mold formed on the support structure 12, then cured. The surface may then be planarized. The resulting lens collimates the light by reflecting/refracting the light impinging on the walls like a reflector cup.

Figure 32:
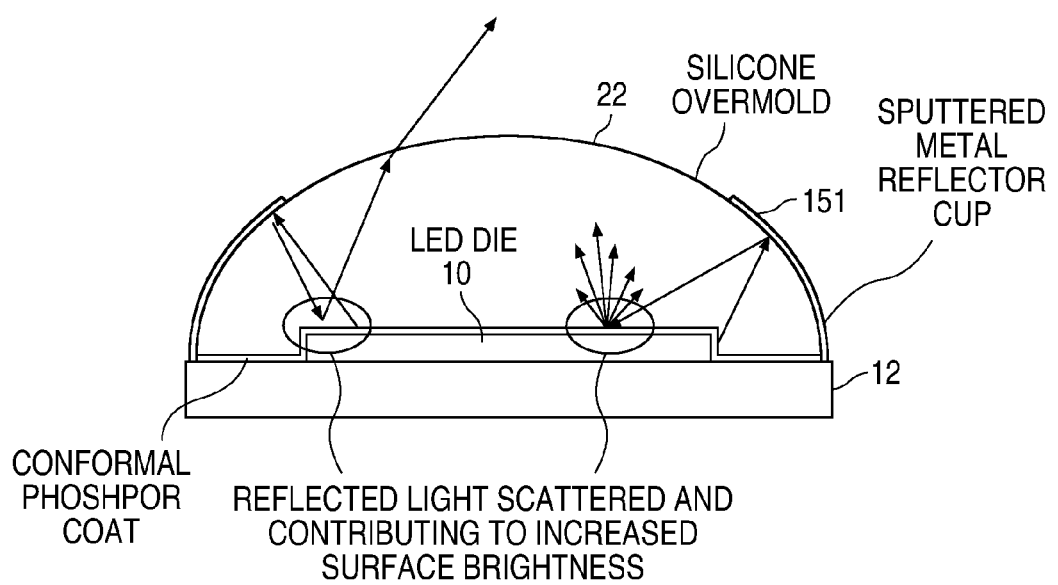
FIG. 32 illustrates depositing a metal reflector over a portion of the lens for achieving a desired emission pattern.

FIG. 32 illustrates a molded lens 22 with metal 151 sputtered around its side to reflect light emitted by the LED 10. The reflected light will be scattered by the LED 10 and be eventually emitted through the top opening. The metal 151 may be any reflective material such as aluminum or silver. The metal may instead be sputtered on the top of the lens 22 to create a side-emission pattern. The lens 22 may be made any shape to create the desired light emission pattern.

Figure 33:
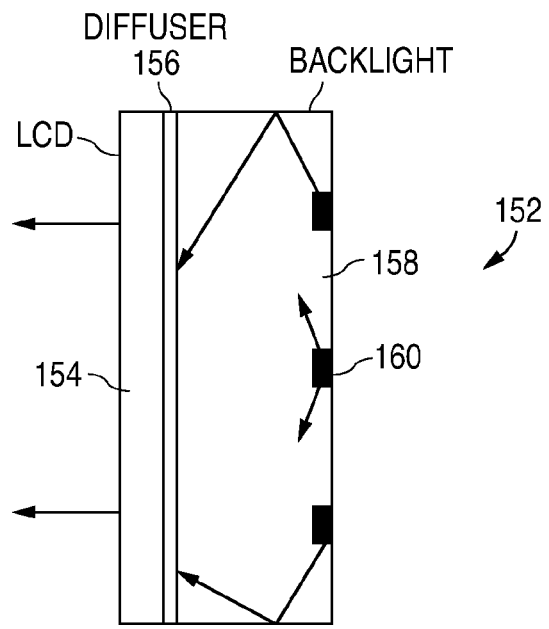
FIG. 33 is a side view of a liquid crystal display using LEDs with side-emitting lenses in a backlight.

FIG. 33 is a side view of a liquid crystal display (LCD) 152 with an LCD screen 154, having controllable RGB pixels, a diffuser 156, and a backlight 158 for mixing light from red, green, and blue LEDs 160 to create white light. The backlight 158 is a diffusively reflective box. The LEDs 160 have side-emitting lenses made using any of the above-described techniques.

Figure 34:
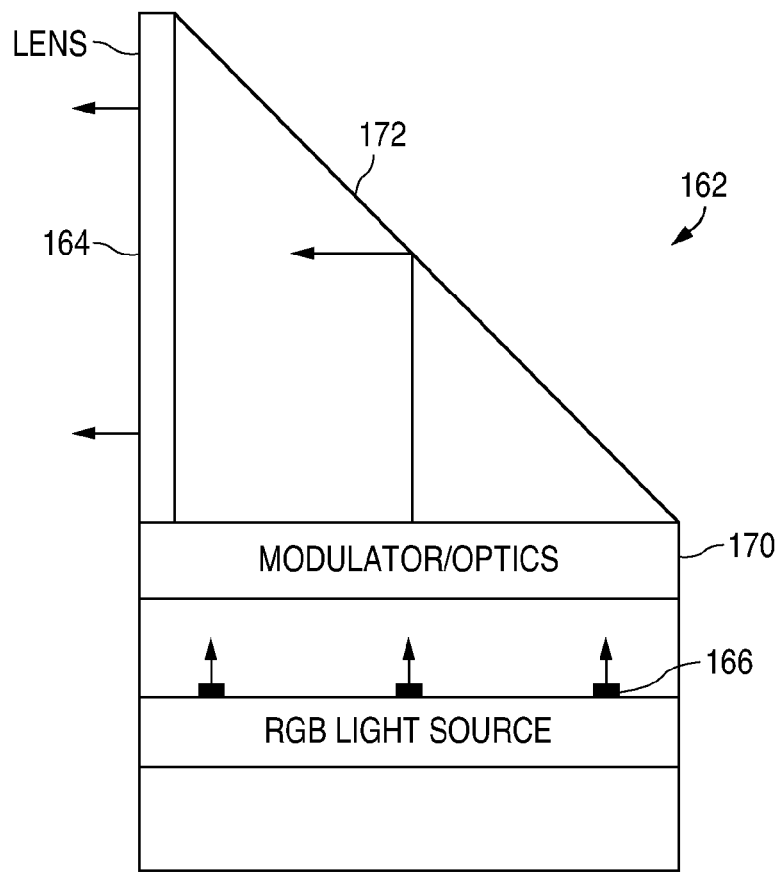
FIG. 34 is a side view of a rear projection TV using LEDs with collimating lenses as a RGB light source.

FIG. 34 is a side view of a rear projection television 162 with a front lens 164 for brightening the image within a specified viewing angle, a set of red, green, and blue LEDs 166, modulator/optics 170 for modulating and focusing the RGB light to produce a color TV image, and a reflector 172. The modulator may be an array of controllable mirrors, an LCD panel, or any other suitable device. The LEDs 166 have collimating lenses made using any of the above-described techniques.

As described above, the primary lens or secondary lens can be designed to create a side-emitting pattern. Such a side emitting pattern is particularly useful when light from multiple LEDs is intended to be mixed, such as when light from multiple LEDs is for creating a uniform backlight for an LCD panel, or for decorative lighting, or for another use.

Figure 35:
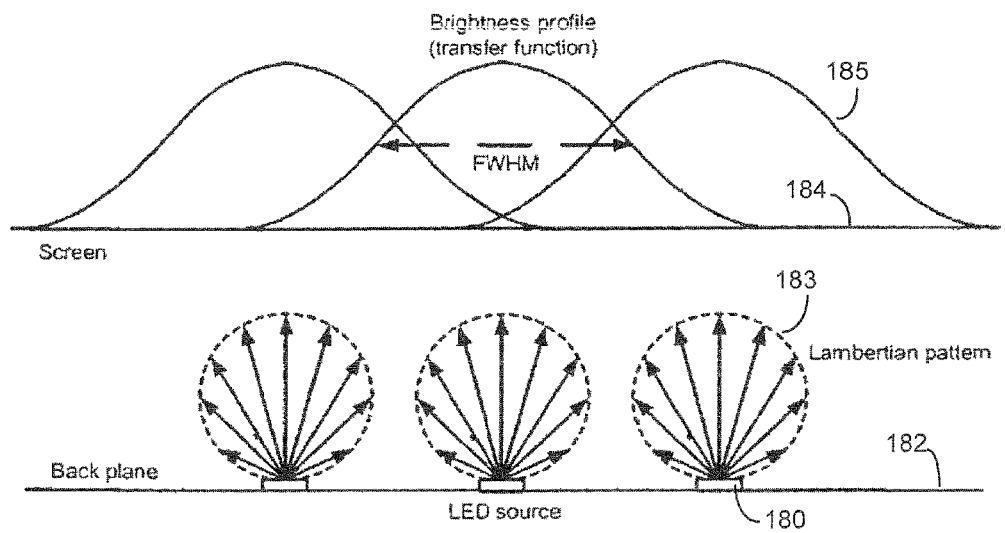
FIG. 35 illustrates prior art LED emission patterns (Lambertian) and their overlapping brightness profiles on a screen.

As shown in FIG. 35, LEDs 180, without lenses or with only hemispherical lenses, mounted on a backplane 182 will typically emit light in a Lambertian pattern 183. The array of LEDs 180 illuminates the back of a diffusive screen 184. The screen 184 may be the diffuser 156 in the LCD backlight of FIG. 33. The diffused brightness profile 185 of each LED and its Full Width At Half Maximum (FWHM) are also shown. The overall light output at the front of the screen 184 will have noticeable bright spots unless the LEDs are placed close enough together. Therefore, such a backlight requires a relatively high density of LEDs, resulting in an expensive backlight.

Figure 36:
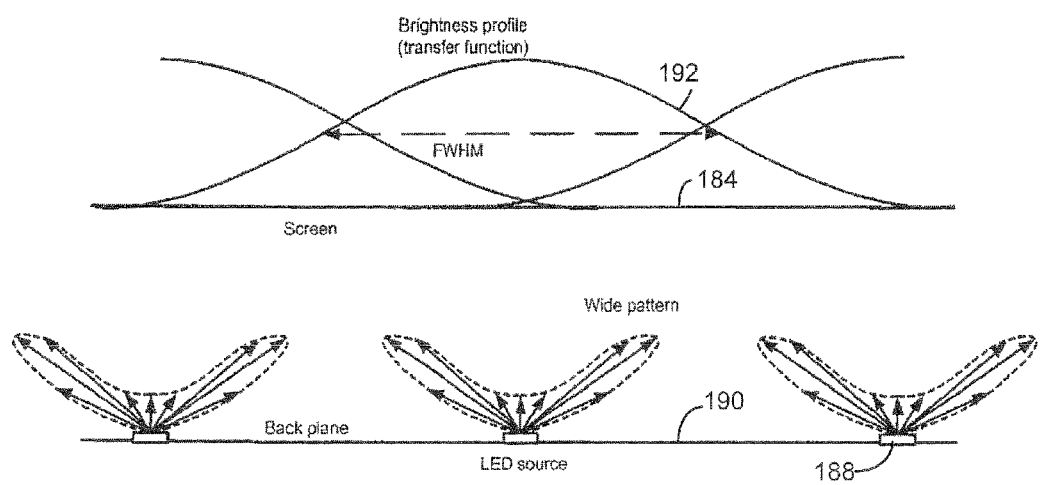
FIG. 36 illustrates the wide angle emission patterns of LEDs using the inventive lens and their overlapping brightness profiles on a screen.
Figure 37:
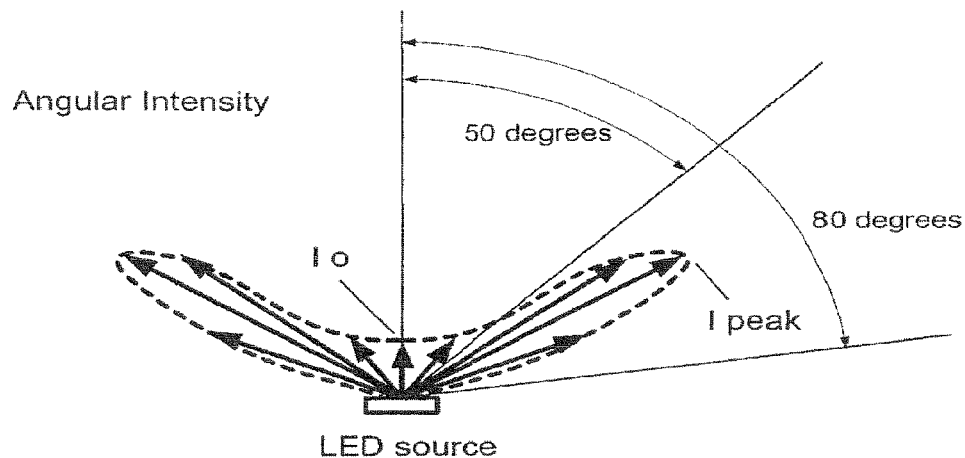
FIG. 37 shows more detail of the emission pattern of the LEDs in FIG. 36.
Figure 38:
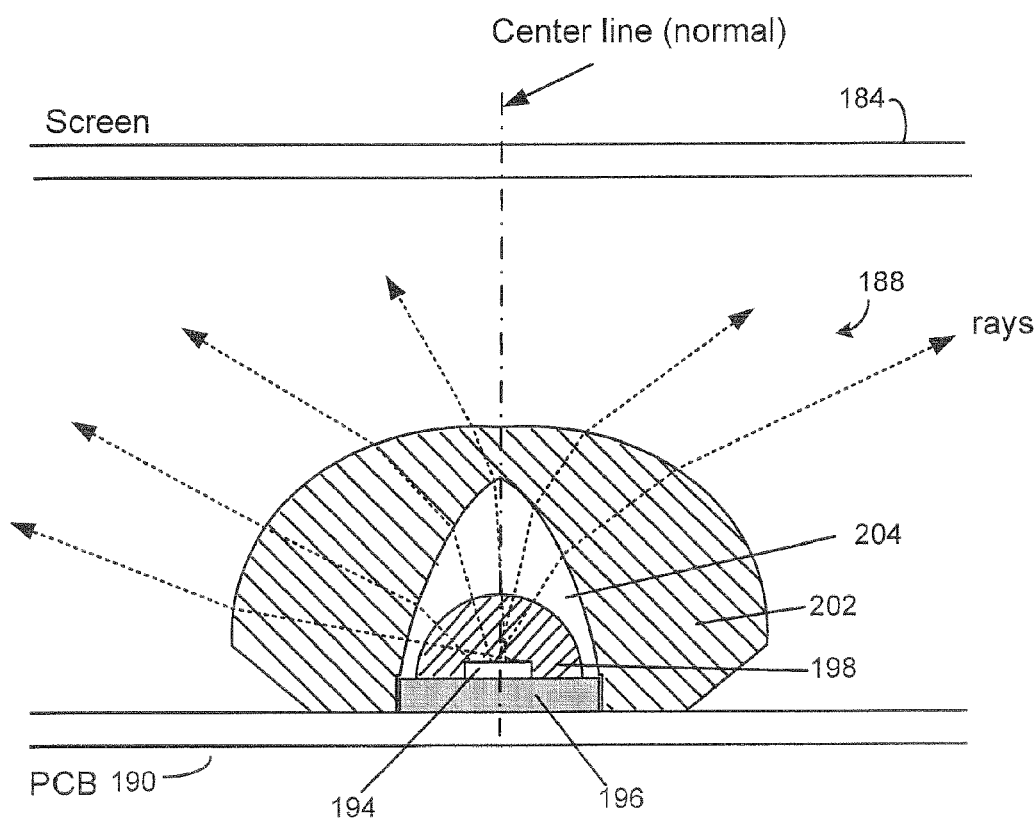
FIG. 38 is a cross-sectional view of an LED and a wide emitting lens in accordance with one embodiment of the invention.

Applicants have invented a wide-emitting lens, shown in FIGS. 36-38, that is particularly useful in a backlight. In FIG. 36, LEDs 188 with the wide-emitting lenses are shown mounted to a backplane 190. The peak light emission (Ipeak) for each LED die occurs within 50-80 degrees off the center axis (normal), as shown in FIG. 37. A range between 70-80 degrees is preferred. The lens is designed so that the light emission ($I_o$) along the center axis is 5%-33% of the peak emission. Accordingly, the brightness profile 192 for each LED is more spread out as compared to the brightness profile 185 in FIG. 35. Therefore, the LED 188 pitch in the backlight of FIG. 36 can be larger than the LED 180 pitch in FIG. 35 while achieving the same light output uniformity from the diffusive screen 184. This results in a less expensive backlight.

The brightness profile should have no sharp transitions like those that typically appear with funnel shaped lenses at the center cusp.

The optimum ratio of the center axis intensity to the 50-80 degree peak intensity will depend on the application, such as the pitch of the LEDs needed to achieve the specified brightness of the backlight. The peak intensity is at least three times the intensity along the center axis and, in the embodiment of FIG. 37, the ratio is between 4-8.

FIG. 38 is a cross-sectional view of one embodiment of a wide-emitting lens with the characteristics described above. An LED die 194 is mounted on a substrate or submount 196 made of ceramic, silicon, or other material, as described with respect to FIGS. 1-6, and a first lens 198 is molded over the LED die 194 as described with respect to FIGS. 1-6. Multiple dies may be mounted on a single large submount. Lens 198 may be formed of any suitable material such as silicone.

The submount 196 is then separated out and then mounted on a backplane 190 (a PCB) by a solder reflow technique or other suitable technique.

A secondary lens 202 is preformed to have the desired wide-emitting characteristics. The secondary lens may be injection-molded or machined plastic or other material. Such materials include COC, COP, PMMA, epoxy, silicone, glass, or any other suitable material. The secondary lens 202 is then mounted to overlie the first lens 198 and contact the backplane 190 for support. An air gap 204 (or other low index of refraction material gap) creates an internal refractive interface that bends light towards the sides. The interface of the outer surface of the secondary lens 202 with air further bends the light to achieve the peak intensity within 50-80 degrees. The secondary lens 202 may directly contact the first lens 198; however, the shape of the secondary lens 202 would have to be changed to achieve the same wide-emitting pattern.

In another embodiment, the secondary lens 202 contacts and is supported by the submount 196 rather than the backplane 190.

The secondary lens 202 may be fixed to the backplane or the submount with an adhesive such as epoxy or may be affixed with a snap-tab connection.

By fixing the secondary lens 202 referenced to the submount, slightly better control over the light emission is achieved as compared to fixing the secondary lens 202 referenced to the backplane because the height of the LED and first lens 198 above the backplane may vary slightly with the mounting parameters.

The aspherical secondary lens 202 with the aspherical dome internal air gap is a simple design that is easily molded. The lens 202 is undercut near the backplane 190 to reflect light upward at the undercut surface so that light is not emitted downward toward the backplane 190. This avoids light rings and increases the backlight's light output.

Figure 39:
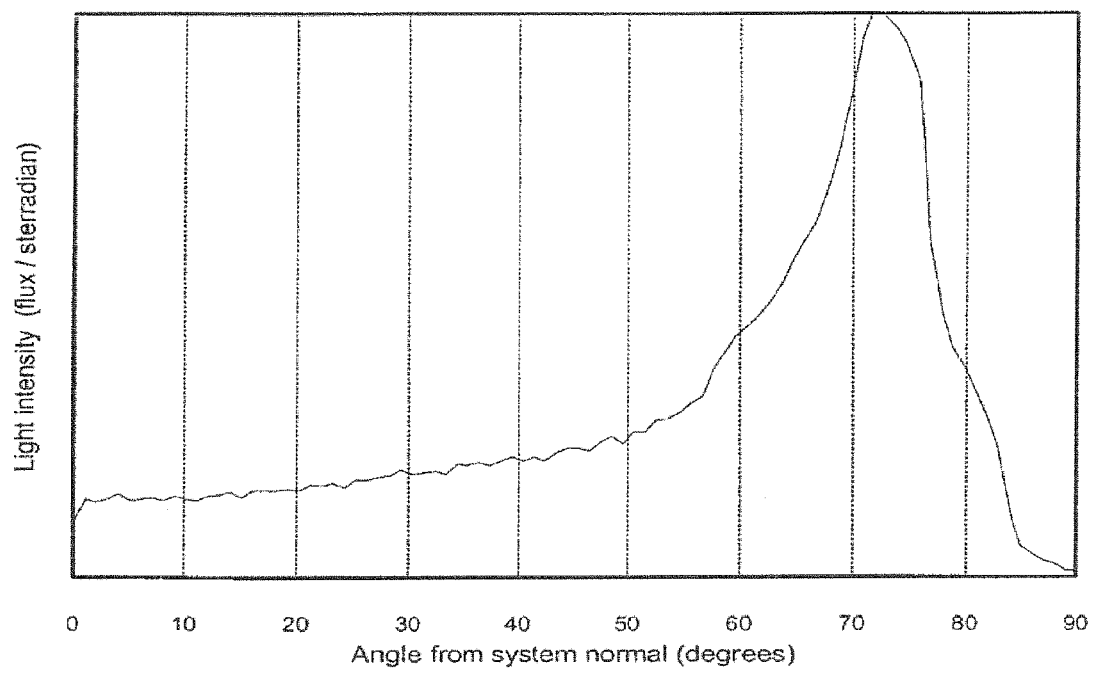
FIG. 39 is a graph of light intensity vs. angle for the lens of FIG. 38.

FIG. 39 shows the light intensity vs. angle for the LED of FIG. 38. The peak intensity is approximately 72 degrees, and the intensity along the center axis is approximately 10% of the peak intensity.

In another embodiment, the surface of the secondary lens 202 contains microstructures, as described with respect to FIGS. 19, 21, and 22, that further refract the light to achieve the desired emission pattern.

Figure 40:
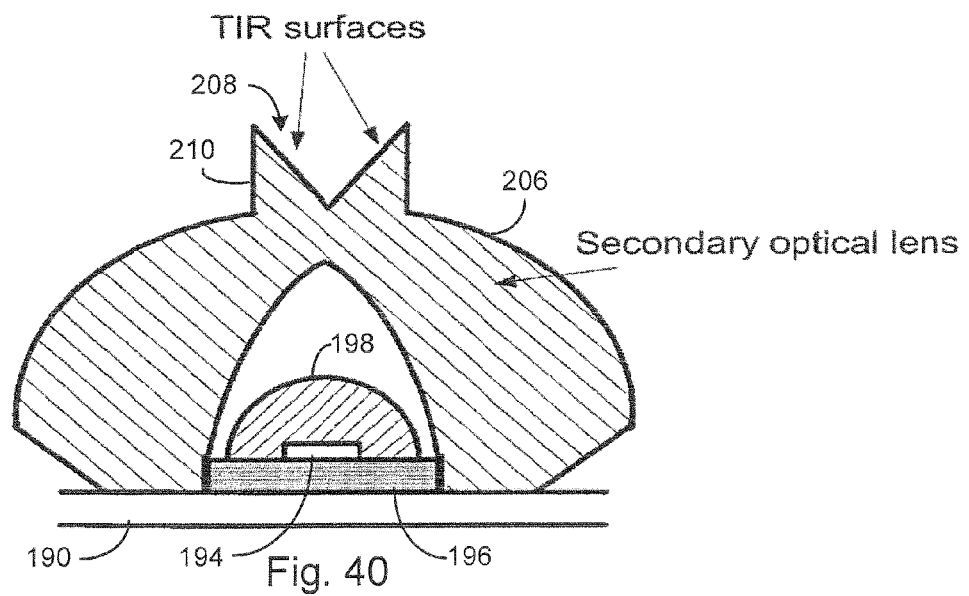
FIG. 40 is a cross-sectional view of an LED and a wide emitting lens in accordance with another embodiment of the invention.

FIG. 40 is a cross-sectional view of an LED 194 with a lens 206 that has a total internal reflection (TIR) portion 208. The TIR portion 208 is funnel-shaped. The TIR portion 208 causes most light emitted upward to be internally reflected and emitted through the side portions 210. Such a design is useful to reduce the intensity along the central axis while still providing a peak intensity within 50-80 degrees and an intensity along the central axis between 5-33% of the peak intensity. Any of the lens embodiments may be employed in the backlight of FIG. 33.

The secondary lenses in FIGS. 38 and 40 and in other figures may also be used over an LED die without a molded first lens. However, use with the molded first lens is preferable to protect the LED. The diameter of the secondary lens will typically range between 4-10 mm.

FIGS. 41A through 41E illustrate steps for overmolding a ceramic phosphor plate and attaching the overmolded plate to an LED die. A phosphor plate can be made to have precise characteristics since its thickness (e.g., 50-300 microns) and phosphor density can be carefully controlled. When the phosphor is energized by blue light (e.g., 440 nm-460 nm), the phosphor emits a longer wavelength light. When the phosphor plate is affixed over a blue LED, a percentage of the blue light passes through the plate, and the blue light is mixed with the light generated by the phosphor.

One way to form a sheet of ceramic phosphor is to sinter grains of the phosphor powder using heat and pressure. The percentage of the blue LED light passing through the plate is dependent on the density of the phosphor and the thickness of the plate, which can be precisely controlled. Another way to form a thin sheet of phosphor is to form a slurry of phosphor in a thin sheet and then dry the slurry. Forming such ceramic phosphor plates is described in U.S. patent publication 20050269582, entitled Luminescent Ceramic for a Light Emitting Diode, by Gerd Mueller et al., incorporated herein by reference.

A popular phosphor to use with a blue LED is a YAG:Ce phosphor (Yttrium Aluminum Garnet doped with about 2% Cerium), which is commercially available.

Figure 41A:
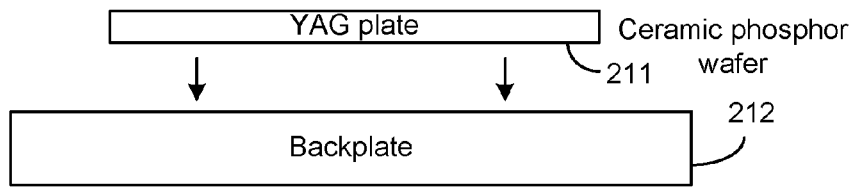
FIGS. 41A through 41E illustrate steps for overmolding a phosphor wafer, then dicing the molded phosphor wafer and attaching the individual overmolded plates to LED dies.

FIG. 41A illustrates a ceramic phosphor plate wafer 211 temporarily mounted on a backplate 212 using any suitable adhesive that can be easily released with force or with a solvent. The backplate 212 may have a Teflon coating that prevents sticking of cured silicone in a later step. The wafer is typically rectangular but can be any shape. The wafer will later be sawed to form phosphor plates for hundreds of LEDs. In this example, the wafer 211 is a YAG phosphor 50-300 microns thick, which emits a green-yellow light when energized with blue light from a blue LED. The resulting white light is generally considered harsh since it has a high color temperature (e.g., 4000-6000K). As described below, red phosphor will be used to lower the color temperature, which is conventionally referred to as creating a warmer white light.

Figure 41B:
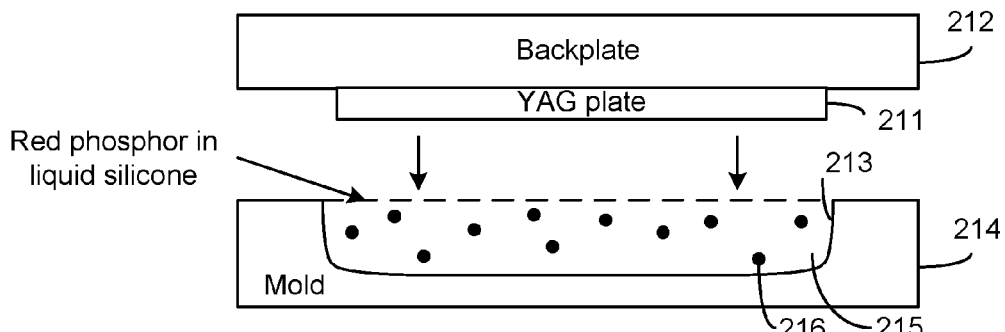

In FIG. 41B, an indention 213 in a mold 214 is filled with liquid silicone 215 containing red phosphor particles 216. A conventional non-stick release film (not shown) conformally coats the mold and later enables the molded silicone to be removed without significant pull. Any type of automated liquid dispenser can be used to dispense the silicone/phosphor mixture. Examples of red phosphor include BaSSN, CaS, and e-CaS, which are well known. The optimal density of the red phosphor particles and shape of the indentation 213 are determined by the desired lowering of the color temperature provided by the red phosphor. Other phosphor particles, such as YAG, green, orange, blue, etc., may also be in the silicone 215 if desired to achieve a certain color temperature. In one embodiment, the silicone 215 used is such that it is relatively soft after curing so that there is little stress on the LED and resulting phosphor plate during operation of the LED structure. In another embodiment, the silicone 215 is the same or equivalent to the silicone later used to form the outer lens.

The backplate 212 and the mold 214 are then brought together so as to immerse the phosphor wafer 211 into the silicone 215. The backplate 212 and mold 214 are clamped together, a vacuum is created around the structure, and the silicone 215 is under compression. Any air bubbles in the liquid silicone are evacuated during this overmolding step. The silicone 215 is then cured by heat or UV. The backplate 212 and mold 214 are then separated, aided by the release film.

The resulting molded phosphor wafer is then sawed to form individual molded phosphor plates, where each plate is approximately the size of an LED. The phosphor-loaded silicone forms a lens over the phosphor plate. In one embodiment, the molded phosphor wafer is retained on the backplate 212 during the sawing process, and the saw blade only cuts through the wafer. This makes the plates easier to pick and place by an automated pick and place machine. In another embodiment, the molded wafer is removed from the backplate 212, then sawed.

Figure 41C:
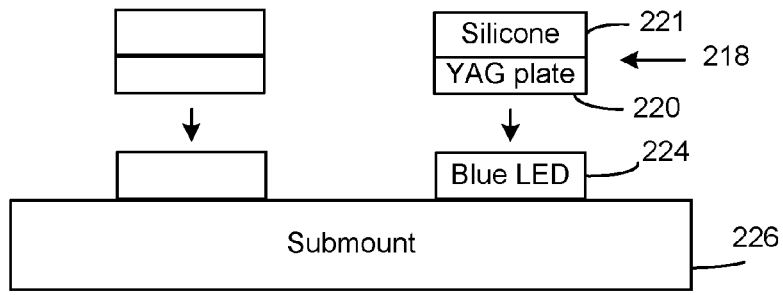

In FIG. 41C, an automatic pick and place arm removes each molded phosphor plate 218 (YAG plate 220 with phosphor-loaded silicone 221) from the backplate 212 and adheres the molded phosphor plate 218 to the top surface of a blue LED 224 mounted on a submount 226 (a wafer at this stage). The submount 226 may contain hundreds of blue LEDs 224 in a two-dimensional array similar to the array shown in FIG. 4. The submount 226 is typically ceramic and contains metal traces and electrodes for each LED for attachment to a power supply. The adhesion of the phosphor plate 218 to the LED 224 may be by low-melting-temperature glass, silicone, epoxy, other transparent adhesive, or heat and pressure.

In one embodiment, to be elaborated on later, the shape of the mold indention 213 is determined by computer modeling to compensate for the non-uniformity of the color temperature vs. angle of the light emitted by the LED/plate combination.

Figure 41D:
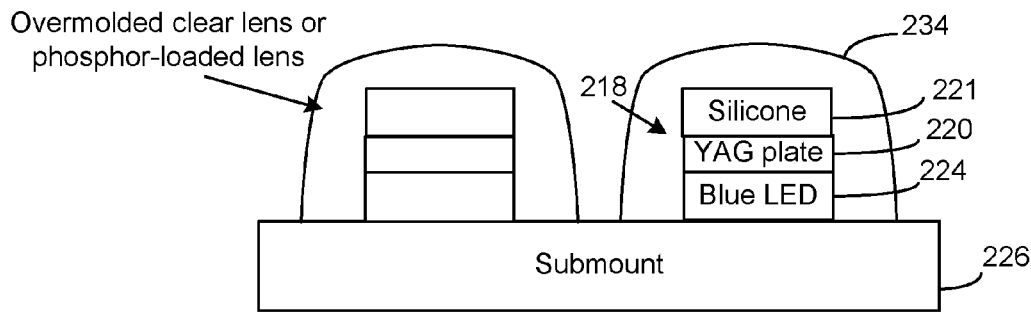

In FIG. 41D, a clear silicone lens 234 is molded over the LED 224 and molded phosphor plate 218 to encapsulate the entire structure. The process described with respect to FIGS. 1-4 and other figures may be used to form the outer lens 234. The molded outer lens 234 improves the light extraction of the LED, achieves a desired light emission pattern, and prevents the phosphor plate 218 from delaminating.

In another embodiment, the outer lens 234 is harder than the phosphor-loaded silicone 221. This results in a mechanically strong outer lens for protection as well as a smooth outer surface that is resistant to dust particles while reducing stress on the LED and interconnections.

The submount 226 is then diced to singulate the LED structures. The LEDs in the above example emit a warm white light, such as within 3000-4000K. Any other phosphors can be used for the phosphor plate and the phosphor in the silicone.

The color temperatures can be further controlled by binning the molded phosphor plates 218 in accordance with their color characteristics after a test. The LEDs 224 on the submount 226 are then tested and categorized in accordance to their color characteristics. The binned molded phosphor plates 218 are then selected for a particular LED to achieve a target color temperature.

Figure 41E:
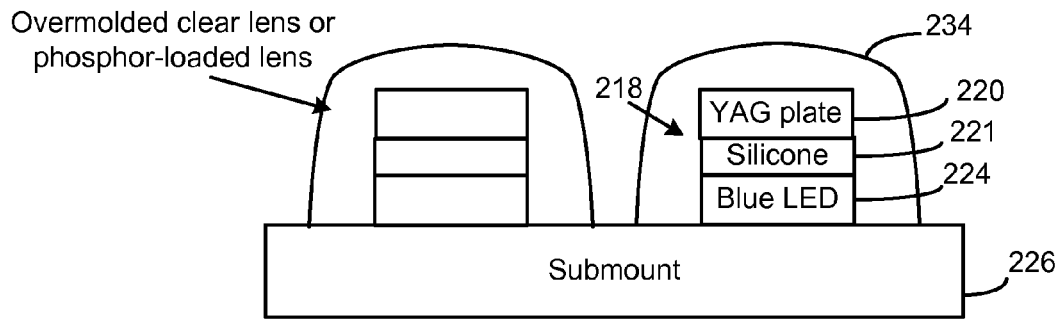

FIG. 41E illustrates another embodiment of the overmolded phosphor plate 218 affixed to an LED 224. In FIG. 41E, the molded phosphor plates 218 are affixed to the LEDs 224 silicone-side down using silicone or heat.

FIGS. 42A through 42E are similar to FIGS. 41A through 41E except that the phosphor plates are diced before being molded. The phosphor sheet is first sawed or broken to create phosphor plates approximately the same size as the energizing LED.

Figure 42A:
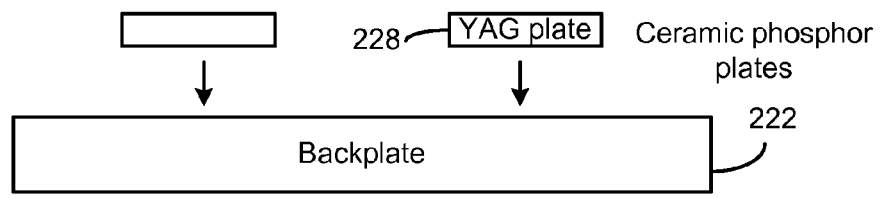
FIGS. 42A through 42E illustrate steps for overmolding phosphor plates and attaching the overmolded plates to LED dies.

FIG. 42A illustrates a two-dimensional array of ceramic phosphor plates 228 being temporarily mounted on a backplate 222 using any suitable adhesive that can be easily released with force or with a solvent. The backplate 222 and phosphor plate characteristics may be the same as in FIGS. 41A-41E.

Figure 42B:
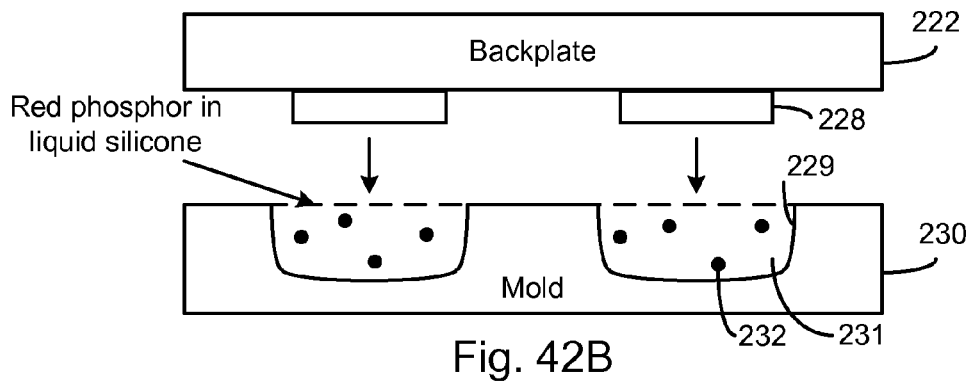

In FIG. 42B, indentions 229 in a mold 230 are filled with liquid silicone 231 containing red phosphor particles 232. A conventional non-stick release film (not shown) conformally coats the mold and later enables the molded silicone to be removed without significant pull. The characteristics of the phosphors, silicone, and mold are similar to those described above.

The backplate 222 and the mold 230 are then brought together so as to immerse the plates 228 into the silicone 231. The backplate 222 and mold 230 are clamped together, a vacuum is created around the structure, and the silicone 231 is under compression. The silicone 231 is then cured by heat or UV. The backplate 222 and mold 230 are then separated, aided by the release film.

Figure 42C:
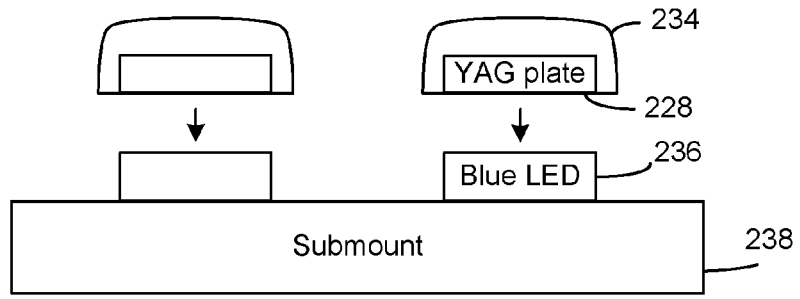

In FIG. 42C, an automatic pick and place arm removes each molded plate 234 from the backplate 222 and adheres the molded plate 234 to the top surface of a blue LED 236 mounted on a submount wafer 238. The submount 238 may contain hundreds of blue LEDs 236 in a two-dimensional array similar to the array shown in FIG. 4. The submount 238 is typically ceramic and contains metal traces and electrodes for each LED for attachment to a power supply. The adhesion of the phosphor plate 228 to the LED 236 may be by low-melting-temperature glass, silicone, epoxy, other transparent adhesive, or heat and pressure.

In one embodiment, to be elaborated on later, the shape of the mold indentions 229 is determined by computer modeling to compensate for the non-uniformity of the color temperature vs. angle of the light emitted by the LED/plate combination.

Figure 42D:
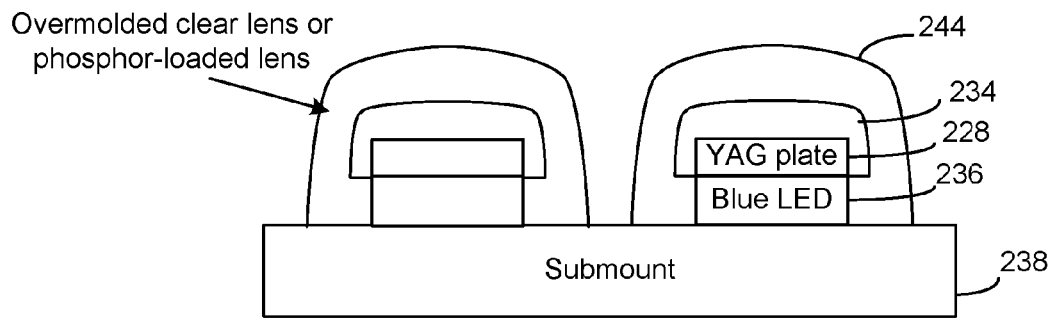

In FIG. 42D, a clear silicone lens 244 is molded over the LED 236 and molded plate 234 to encapsulate the entire structure. The process described with respect to FIGS. 1-4 and other figures may be used to form the outer lens 244.

The submount 238 is then diced to singulate the LED structures. The LEDs in the above example emit a warm white light, such as within 3000-4000K. Any other phosphors can be used for the phosphor plate and the phosphor in the silicone. The advantages of binning and matching were described with respect to FIGS. 41A-41E.

Figure 42E:
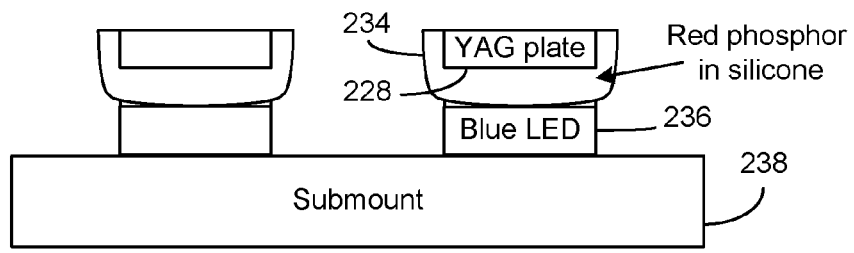

FIG. 42E illustrates another embodiment of the overmolded phosphor plate 234 affixed to an LED die. In FIG. 42E, the molded plates 234 are affixed to the LEDs 236 lens-side down using silicone or heat. To simplify the pick-and-place process, the backplate 222 (FIG. 42B) may be released from the molded plates while the molded plates are still in the mold 230. The pick-and place arm then attaches to the exposed plate, removes the molded plate from the mold 230, and places it on the LED 236.

In FIGS. 41A-E and 42A-E, the first molding step only covers the phosphor plates. FIGS. 43A through 43D show a process where the first molding step also encapsulates the LED.

Figure 43A:
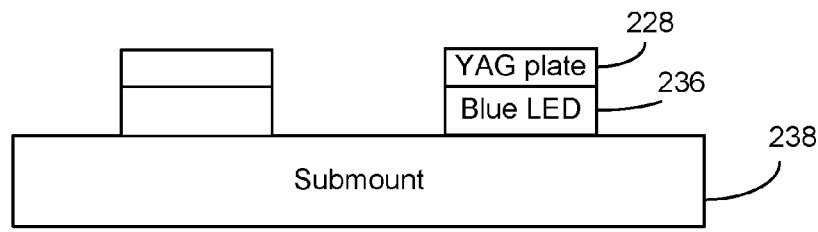
FIGS. 43A through 43D illustrate steps for overmolding an LED with a phosphor plate, where the lens material contains red phosphor to create warm white light.

In FIG. 43A, the phosphor plates 228 (e.g., YAG) are affixed to the LED dies 236 on the submount 238.

Figure 43B:
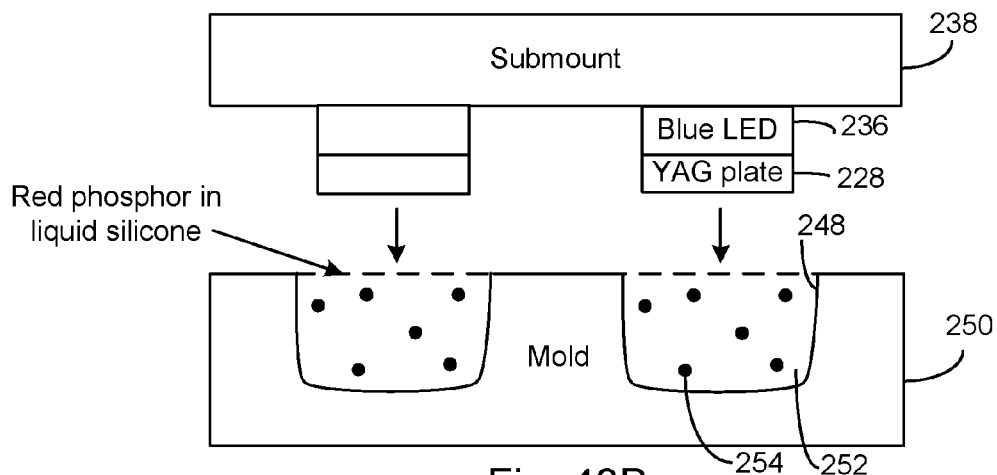

In FIG. 43B, indentions 248 in a mold 250 are filled with liquid silicone 252 containing red phosphor particles 254. As mentioned above, other phosphors may also be used. The submount 238 and mold 250 are brought together, and the silicone 252 is heated to cure it. The resulting silicone may be relatively soft for reasons stated above or may be the same or similar to the silicone used to form the outer lens.

Figure 43C:
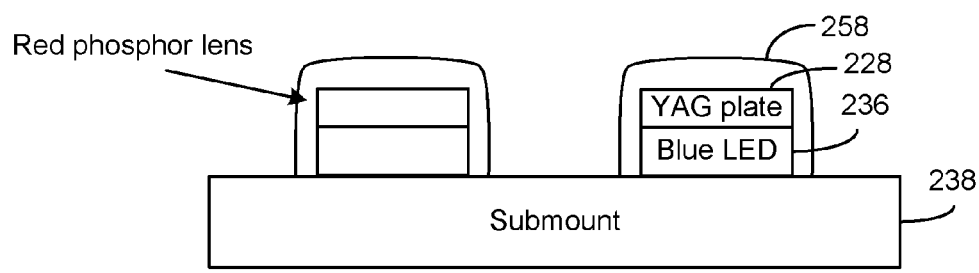

In FIG. 43C, the submount 238 and mold 250 are separated so that a red phosphor lens 258 encapsulates each LED and phosphor plate, creating a warm white light.

Figure 43D:
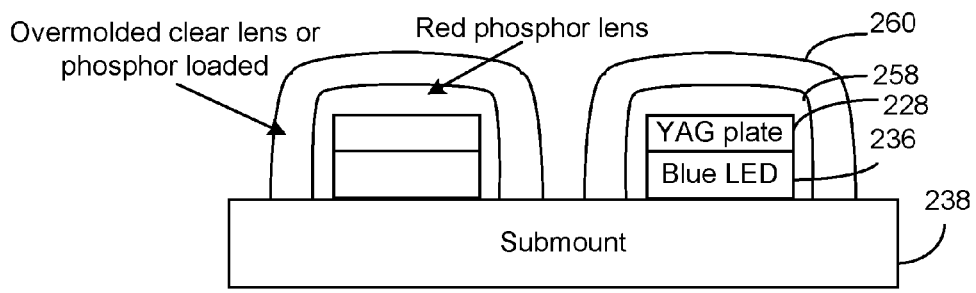

In FIG. 43D, a hard silicone lens 260 is molded over the each LED, using the molding processes described herein, to encapsulate and protect the entire LED structure. As in all embodiments, the outer lens 260 may be shaped by the mold to create virtually any light emission pattern, such as lambertian, side-emitting, collimated, etc.

Figure 44A:
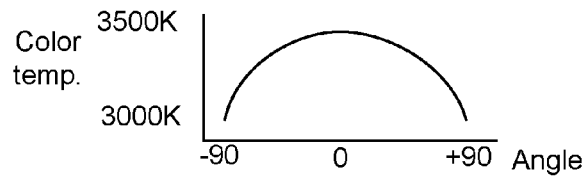
FIGS. 44A through 44C illustrate an LED with a flat phosphor layer, where a mold is custom-shaped to form a phosphor-loaded lens that compensates for non-uniformity in color vs. angle.
Figure 44A:
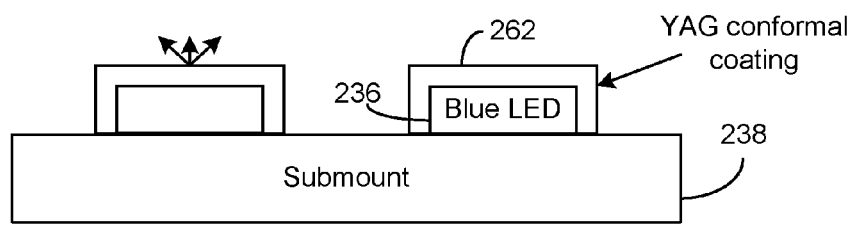
Figure 44B:
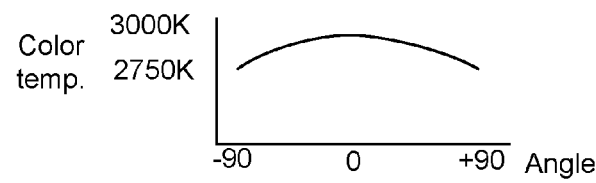
Figure 44B:
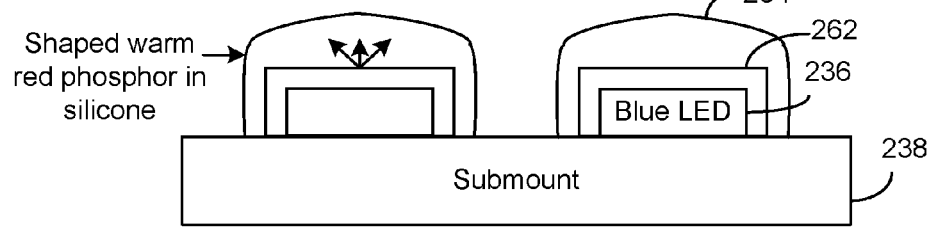
Figure 44C:
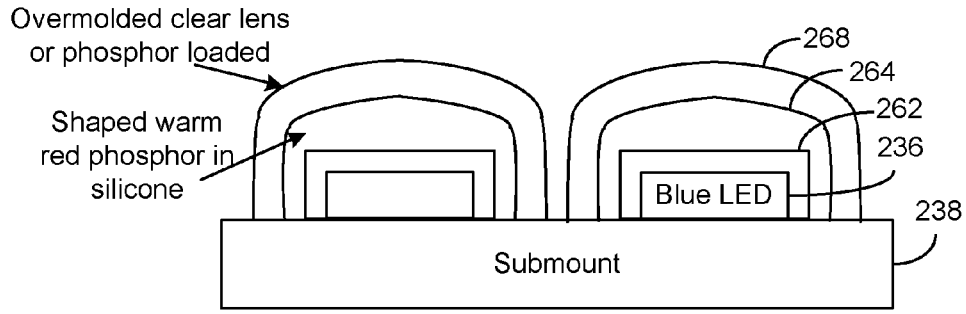

FIGS. 44A through 44C illustrate the use of the molding process to create a more uniform color temperature vs. viewing angle.

In FIG. 44A, a YAG phosphor 262 powder conformally coats the LED 236, resulting in a flat phosphor surface. One way to conformally coat an LED with phosphor is by electrophoretic deposition. Electrophoretic deposition is described in U.S. Pat. No. 6,576,488, entitled "Using Electrophoresis to Produce a Conformally Coated Phosphor-Converted Light Emitting Semiconductor," by Dave Collins et al., incorporated herein by reference. The process of FIGS. 44B and 44C also applies when the phosphor is a plate, such as shown in FIG. 43A. The process of FIGS. 44B and 44C also applies to any LED structure where the color temperature vs. angle is desired to be more uniform.

The color temperature graph shown in FIG. 44A indicates that the color temperature of the phosphor-coated LED at a 0% viewing angle is cooler (higher CCT or bluer) than at other viewing angles. This is because the blue light travels the least distance through the phosphor when traveling normal to the surface. As a result, the white light changes color as the LED is viewed from different angles. Although the range of color temperatures shown is from 3000K to 3500K, the temperatures may be higher (e.g., up to 6000K) or lower depending on the particular phosphor and thickness of the coating.

It would be very difficult to precisely form a phosphor coating that varies in thickness so that the blue light travels the same distance through the phosphor at all angles.

To compensate for this color vs. angle non-uniformity, a molded lens containing a substantially homogenous distribution of a compensating phosphor is used. In one example, a red phosphor is dispersed in liquid silicone in a mold, similar to mold 250 in FIG. 43B. The dimensions of the mold are determined by computer modeling based on the actual color temperature vs. angle characteristics of the LED to be corrected. Generally, the mold will be convex, where the precise width, depth, curvature, and phosphor density are determined by the computer modeling. The LED with the phosphor coating is placed into the liquid silicone, and the silicone is cured. The LED with the molded lens is then removed from the mold.

FIG. 44B illustrates one example of the compensating molded lenses 264 containing the red phosphor. Other compensating phosphors may be used, depending on the desired color temperature. As seen by the graph of color temperature vs. angle, the average temperature is lowered by the added red component from the red phosphor, and the temperature delta is lowered from 500K (from FIG. 44A) to 250K, creating a more uniform color temperature vs. angle. Lens 264 is preferable relatively soft to reduce stress on the LED.

In FIG. 44C, a hard silicone lens 268 is molded over the color compensating lens 264 using previously-described techniques.

Figure 45A:
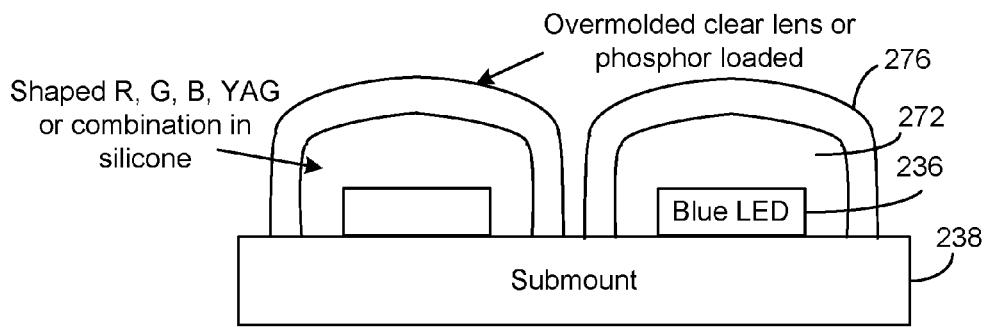
FIGS. 45A and 45B illustrate an LED without a flat phosphor layer, where a mold is custom-shaped to form a phosphor-loaded lens that improves the uniformity of color vs. angle.

FIG. 45A illustrates an LED 236 without a flat phosphor layer, where a mold is custom-shaped to form a phosphor-loaded lens 272 that improves the uniformity of color temperature vs. angle. Computer modeling is used to determine the optimum shape of the mold and the phosphor density based on the color vs. angle of the LED. Generally, the shape of the lens 272 causes the blue light to travel through approximately the same thickness of the lens over a wide range of angles. The relative size of the lens would be much larger than shown in FIG. 45A. The phosphor in the lens 272 may be a combination of YAG and red or any other phosphor. The phosphor distribution in the lens is substantially homogenous. Multiple overlapping molded lenses may also be used to achieve the desired color characteristics.

A hard outer lens 276 is then molded over the softer compensating lens 272. The lens 276 may be clear or contain a phosphor.

Figure 45B:
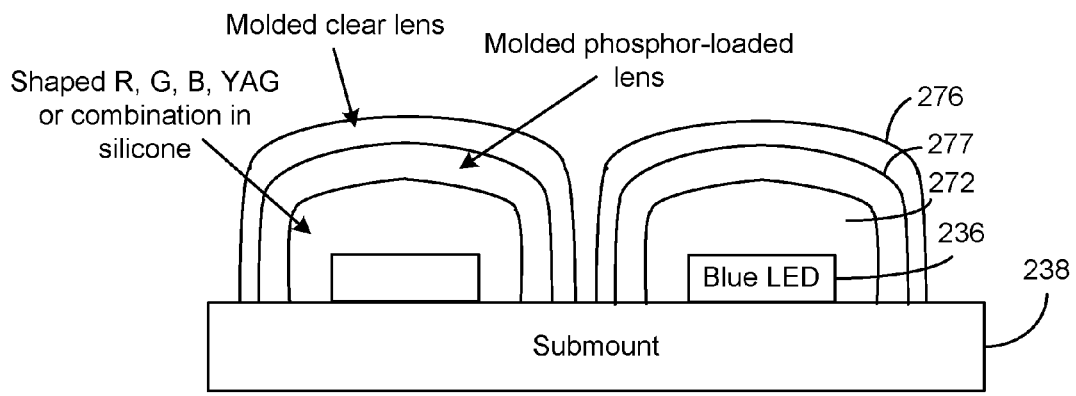

In FIG. 45B, the inner molded lens 272 contains YAG phosphor, an intermediate molded lens 277 contains red phosphor, and a hard outer lens 276 contains no phosphor. Both of lenses 272 and 277 can be shaped to provide a substantially uniform color temperature vs. angle. Other types of phosphors and additional phosphor-loaded lenses may also be used. In some cases, better control over the color and color temperature vs. angle is provided by not mixing all the phosphors into a single lens. A clear outer lens generally increases the light extraction.

FIGS. 46A through 46D illustrate molding lenses over an LED die and another type of semiconductor chip, such as a transient voltage suppressor (TVS) or a photodetector.

Figure 46A:
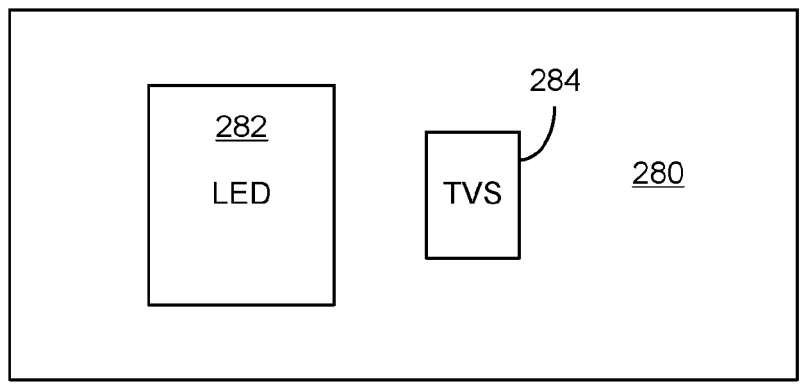
FIGS. 46A through 46D illustrate molding a lens over an LED die and another type of semiconductor chip, such as a transient voltage suppressor.

FIG. 46A is a top down view of a portion of a submount 280 showing an LED 282 and a TVS chip 284 connected between the power leads of the LED 282. The metal traces on the submount 280 are not shown. Upon a voltage surge, such as due to an electrostatic discharge (ESD), the circuit in the TVS chip 284 shorts the transient voltage to ground to bypass the LED 282. Otherwise, the LED 282 may be damaged. TVS circuits are well known. To Applicants' knowledge, prior art TVS circuits are not encapsulated with a portion of the lens used for the LED. The submount 280 shown in FIG. 46A is part of a wafer on which is mounted many pairings of LEDs and TVS dies. The submount wafer will be later sawed to singulate the LED/TVS pairs.

Figure 46B:
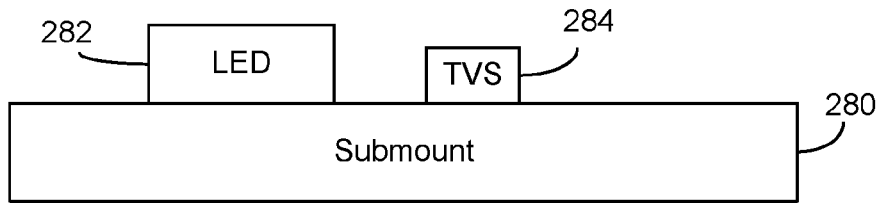
Figure 46C:
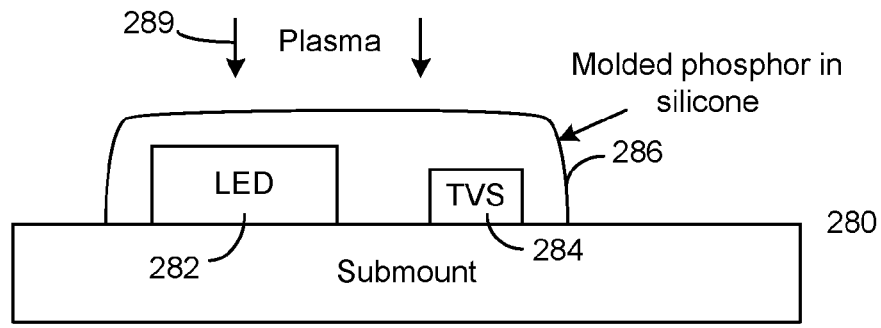

FIG. 46B is a side view of the submount 280. A mold, similar to that shown in FIG. 43B and other figures, has indentations that are filled with liquid silicone containing phosphor grains. The submount wafer and mold are brought together so that each LED/TVS pair is within the silicone in a single indentation, and the silicone is then cured. The submount wafer is then separated from the mold, and the structure of FIG. 46C results. The molded phosphor lens 286 encapsulates both chips. The type(s) of phosphor used, the density of the phosphor(s), and the shape of the lens 286 are determined by the desired color temperature characteristics. In one embodiment, the phosphor in the lens 286 is a mixture of YAG and red phosphor to create a warm white light when energized by the blue LED 282.

Figure 46D:
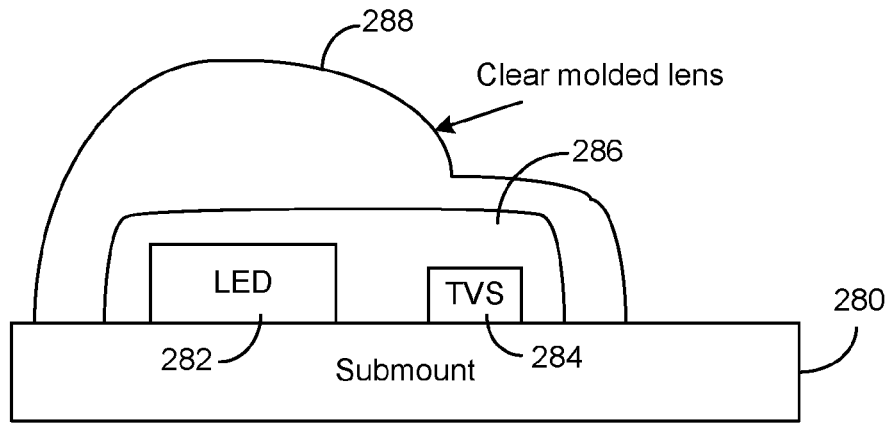

As shown in FIG. 46D, a second overmolding process is performed, similar to the processes previously shown, to form a clear silicone lens 288 over the molded phosphor lens 286. As with the other embodiment, the inner lens 286 is preferably softer than the outer lens 288. The outer lens 288 is shaped to provide the desired refraction of the light to achieve virtually any emission pattern and also completely encapsulates the chips. The portion of the outer lens 288 over the TVS chip 284 has little effect on the light emission pattern of the LED. In an actual embodiment, the thickness of the two chips is typically much smaller relative to the height of the outer lens than shown in FIG. 46D. For example, the thickness of the LED 282 may be 120 microns (with its growth substrate removed), the molded phosphor lens 286 may have a thickness of 100 microns over the LED, and the outer lens 288 may have a thickness of 1000 microns over the molded phosphor lens 286.

The footprint of the molded phosphor lens 286 need not be rounded like the footprint of a hemispherical outer lens. The footprint of the phosphor lens 286 may be rectilinear to just cover the LED and TVS pair.

As in all embodiments, the outer lens may contain one or more phosphor types to achieve any color temperature, such as warm white.

Although an outer silicone lens may be simply molded over an inner silicone lens, it has been discovered that an intermediate plasma treatment of the inner lens increases the adhesion between the two lenses. The plasma treatment slightly etches and roughens the lens. Subjecting the inner lens to a plasma power of 200 Watts for a few minutes (e.g., 2-15 minutes) is sufficient to ensure the adhesion between the two silicone lenses is greater than the adhesion of the outer lens to the mold release film. The plasma power may be approximately 200-600 Watts. The plasma gas may be any suitable inert gas, such as argon, and the process may be performed in any suitable chamber that can create a plasma. FIG. 43C illustrates the optional plasma 289 step. The plasma step may be performed in any embodiment where two or more overmolded lenses are formed. Providing a clear silicone lens as an outer lens has been shown to increase the light output power by 24% due to its index of refraction being lower than the index of refraction of phosphor-loaded silicone.

In FIGS. 46A-46D, the LED may be any color such as blue, cyan, green, etc., and multiple LEDs may be overmolded with a non-LED chip.

Figure 47A:
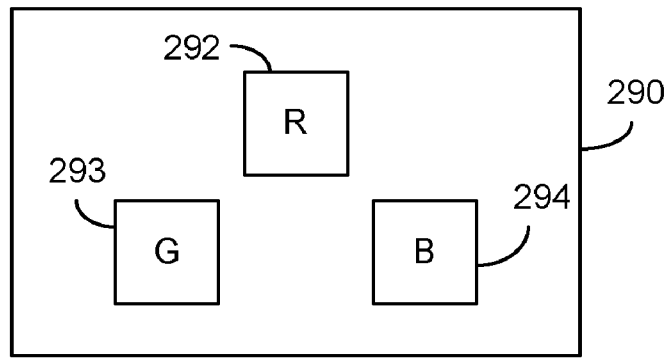
FIGS. 47A through 47C illustrate molding a single lens over multiple LEDs of different colors.
Figure 47B:
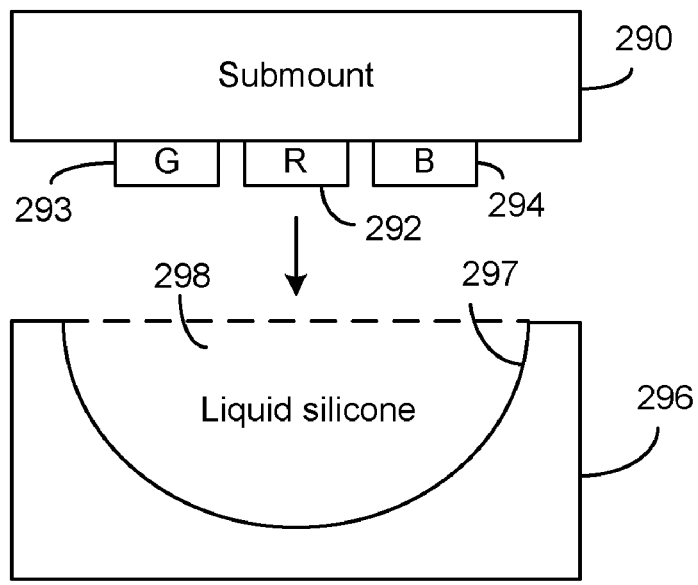
Figure 47C:
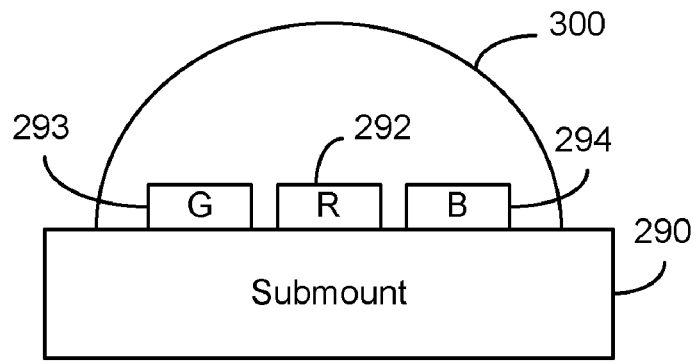

FIGS. 47A through 47C illustrate molding a single lens over multiple LEDs of different colors. FIG. 47A is a top down view of a portion of a submount 290 containing a red LED 292, a green LED 293, and a blue LED 294. The metal traces are not shown. The submount wafer contains many such groups, each group creating white light having any desired color temperature depending on the relative brightness levels of the RGB LEDs.

The arrangement, colors, and ratio of each color are not limited. For example, the group of LEDs could also include a white LED, or the group could include 2-3 red LEDs by themselves or along with one or more green and blue LEDS, or the group may be 2 white LEDs plus an amber LED.

In FIG. 47B, a mold 296 has indentations 297 filled with liquid silicone 298 for forming a single lens over each group of RGB LEDs on the submount wafer. The submount 290 is clamped against the mold 296, and the silicone is cured.

In FIG. 47C, the submount wafer and mold 296 are then separated to form a molded lens 300 over the group of LEDs. In one embodiment, the lens 300 contains one or more phosphors. The submount wafer is then singulated or the entire submount wafer may form an LED display unit. Any number and colors of the LEDs may be encapsulated by a single overmolded lens.

Figure 48A:
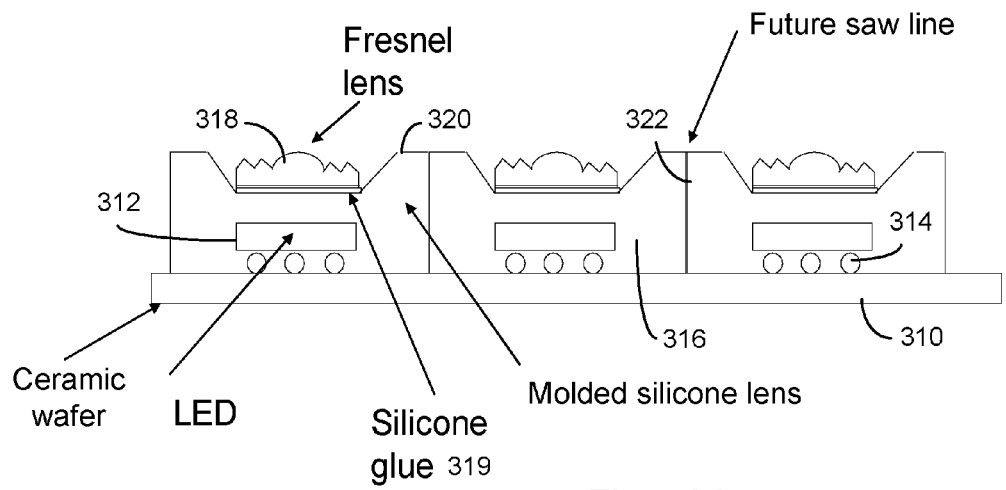
FIGS. 48A through 48C illustrate molding a lens over an LED and then affixing a collimating lens on a flat portion of the overmolded lens.
Figure 48B:
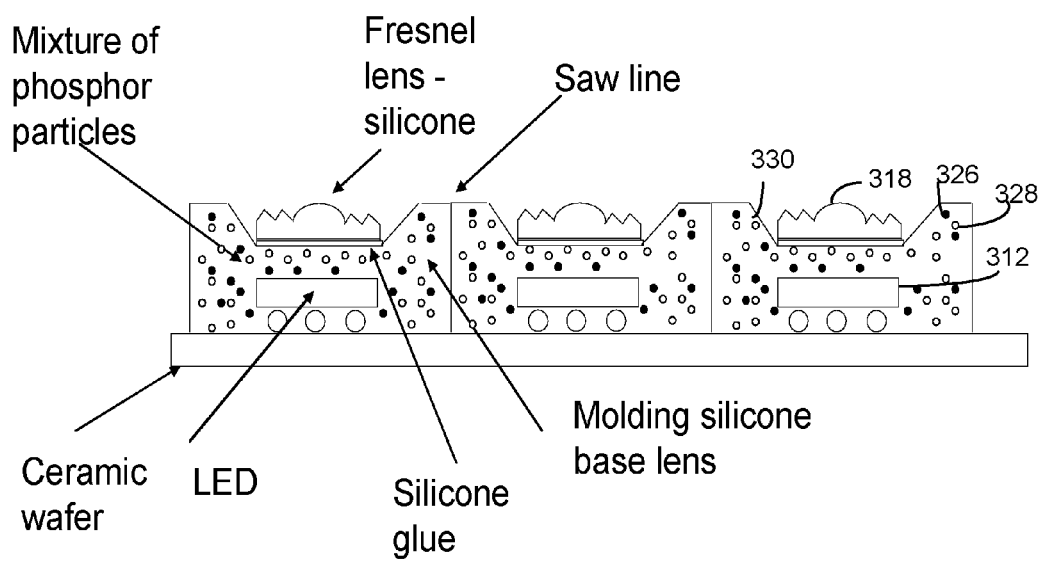
Figure 48C:
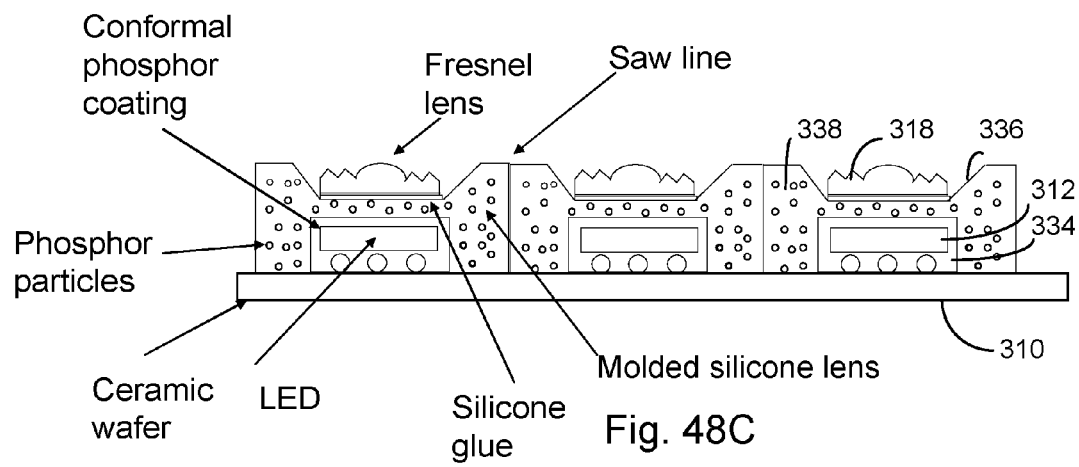

FIGS. 48A through 48C illustrate overmolding a lens on an LED and then affixing a collimating lens on a flat portion of the overmolded lens.

In FIG. 48A, a submount wafer 310 has mounted on it an array of LEDs 312. Bottom electrodes of each LED die are ultrasonically bonded to metal contact pads on the submount using gold balls 314. Other bonding techniques can also be used. The submount wafer 310 is then clamped to a mold with each LED being within a mold indentation previously filled with liquid silicone. The indentations are in the shape of the molded silicone lenses 316 shown in FIG. 48A. The silicone is then cured. The submount wafer 310 is then separated from the mold. Each molded lens 316 encapsulates an LED and has a flat top portion.

A preformed Fresnel lens 318 is then affixed to the flat portion of the molded lens 316 by silicone glue 319, epoxy, or by other means. The Fresnel lens 318 has very fine features that collimate the light. The reason why the Fresnel lens cannot be directly formed in the molded lens 316 by a pattern in the mold is that the release film (which forms a 50 micron layer over the mold) cannot contour to such fine patterns in the mold. If the mold is formed of a non-stick substance and the release layer is not needed, then a Fresnel lens may be directly molded into the lens. The separate Fresnel lens 318 may be formed by stamping a softened plastic material or using other means. In one embodiment, the Fresnel lens 318 has a circular footprint.

A wall portion 320 of the molded lens 316 surrounds each Fresnel lens 318 and is approximately the same height as the Fresnel lens 318. This wall portion 320 has angled sides that reflect upward any light emitted from the sides of the Fresnel lens 318. Additionally, the wall portion 320 protects the Fresnel lens 318 from being bumped. Providing the molded lens with wall portions is optional, and the molded lens can be any shape that supports another lens on top.

The submount wafer 310 is then sawed along the saw lines 322 to singulated the collimated light sources. In one embodiment, the light sources of FIGS. 48A-C are used as a miniature flash for the cell phone camera of FIG. 16. Other types of collimating lenses may be used.

The molded lens may also contain phosphor, as shown in FIG. 48B. In FIG. 48B, the LED emits blue light and different types of phosphors 326, 328 are dispersed in the liquid silicone when molding the lens 330. In one embodiment, the phosphors provide at least red and green components to the blue light to create white light. In one embodiment, the phosphors include a YAG phosphor and a red phosphor for warm white light.

FIG. 48C illustrates an embodiment where the blue LED 312 is conformally coated with a phosphor 334, such as YAG. The coating may be done using electrophoresis. The molded silicone lens 336 contains a red phosphor 338 to produce a warm white light.

Figure 49A:
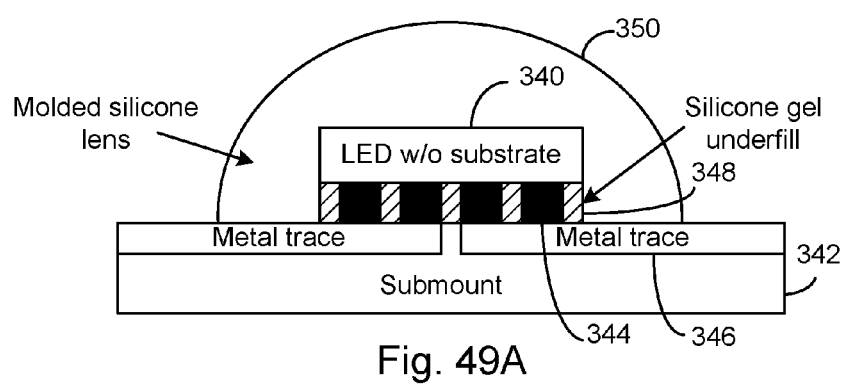
FIGS. 49A and 49B illustrate the use of a silicone gel underfill to fill voids under an LED die, where the LED is then encapsulated by a hard outer lens.
Figure 49B:
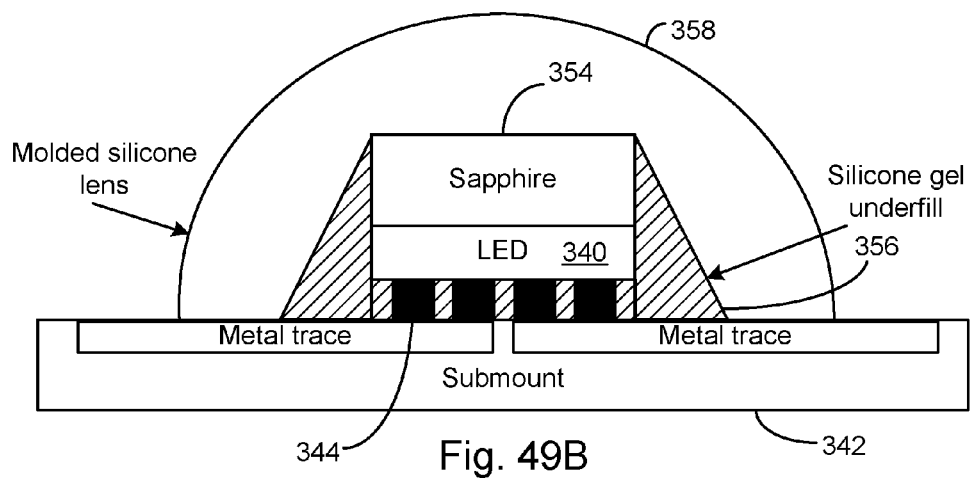

FIGS. 49A and 49B illustrate the use of a silicone gel underfill to fill voids under an AlInGaN LED die, where the LED is then encapsulated by a hard outer lens. In FIG. 49A, an LED 340, with its growth substrate (e.g., sapphire) facing upward, is mounted on a submount 342 so that metal contacts 344 on the LED 340 are bonded to metal traces 346 on the submount 342. The metal traces terminate in wire bond pads or surface mount pads on the bottom of the submount 342. An underfill material 348, such as a silicone gel, is then injected under the LED 340 to fill the voids created between the LED 340 and the submount 342. The gel is then cured. The cured gel remains relatively soft.

An excimer laser beam is then applied to the transparent growth substrate, which heats the GaN LED surface and disassociates the GaN at the surface to create gallium and nitrogen gas. The nitrogen expands to lift the sapphire substrate off the GaN LED, and the sapphire substrate is removed. Tremendous downward pressure is created during this process, and the underfill 348 mechanically supports the thin LED layers to prevent breakage of the LED. The underfill 348 also helps to conduct heat from the LED to the submount during operation of the LED.

A hard silicone lens 350, either clear or phosphor-loaded, is then molded over the LED using the techniques described herein. The underfill 348 prevents the liquid outer lens material in the mold from entering the voids. This reduces the thermal stress on the LED during operation, which otherwise may result in the LED lifting off from the submount. The underfill can be optimized to perform its function without concern over its optical properties.

FIG. 49B illustrates an embodiment where the sapphire growth substrate 354 is left on the LED layers. The underfill 356 may be deposited along the sides of the LED 340 and substrate 354 to ensure all voids are filled and to reduce pressure between the LED/substrate and the hard outer molded lens 358 when the LED is heated and cooled during operation. Further, if the underfill is not transparent, the underfill along the sides blocks the side emission, which is advantageous if a phosphor layer is over the top of the substrate. As in all embodiments, the outer lens may be phosphor-loaded.

In all embodiments described herein, an underfill silicone gel may be employed. Further, an LED emitting UV light may be used in place of the blue LEDs described herein, and a blue phosphor may be dispersed in a molded lens.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A process for forming a light emitting diode (LED) structure comprising:
   providing an LED emitting blue light on a submount;
   affixing a substantially flat preformed phosphor plate to the LED, the preformed phosphor plate containing YAG phosphor emitting a yellow light, wherein a combination of blue light from the LED leaking through the phosphor plate and the yellow light produces white light;
   providing a mold having an indention corresponding to an intermediate lens;
   filling the indention with a liquid lens material containing a phosphor that generates at least red light when excited by the blue light leaking through the phosphor plate;
   after the step of filling, immersing at least the phosphor plate and a portion of the LED into the liquid lens material in the mold; and
   curing the liquid lens material to form a phosphor-loaded lens over the phosphor plate and LED.

2. The process of claim 1 wherein the liquid lens material encapsulates the LED and phosphor plate.

3. The process of claim 1 further comprising molding a clear lens over the phosphor-loaded lens and the LED by immersing the phosphor-loaded lens and the LED in a liquid lens material in a mold indention and then curing the liquid lens material.

4. The process of claim 1 further comprising determining a color temperature vs. viewing angle of the LED with the phosphor plate affixed to it, and then shaping the mold indention to increase uniformity of the color temperature vs. viewing angle.

5. The process of claim 1 wherein the combination of light from the LED, the phosphor plate, and the phosphor-loaded lens produces white light.

6. The process of claim 1 wherein the LED is mounted on a submount along with a plurality of identical LEDs, wherein the step of immersing at least the phosphor plate into the liquid lens material in the mold comprises immersing all the LEDs on the submount into the liquid lens material in an associated mold indentation at the same time.

7. A process for forming a light emitting diode (LED) structure comprising:
   providing an LED emitting blue light or UV light on a submount;
   molding a first phosphor phosphor-loaded lens containing a first phosphor over the LED;
   molding a second phosphor-loaded lens over the first phosphor-loaded lens, the second phosphor-loaded lens containing a second phosphor different from the first phosphor; and
   determining a color temperature vs. viewing angle of the LED with the first phosphor-loaded lens, and then molding the second phosphor-loaded lens to increase uniformity of the color temperature vs. viewing angle.

8. A process for forming a light emitting diode (LED) structure comprising:
   providing an LED on a submount;
   providing a first mold having a first indention with a shape corresponding to a first lens;
   filling the first indention with a first liquid lens material;
   after the step of filling, immersing the LED into the first liquid lens material in the first mold;
   curing the first liquid lens material to form the first lens over the LED;
   removing the LED with the first lens from the first mold;
   plasma treating the first lens;
   providing a second mold having a second indention with a shape corresponding to a second lens;
   filling the second indention with a second liquid lens material;
   after the step of filling the second indentation, immersing the LED and first lens into the second liquid lens material in the second mold;
   curing the second liquid lens material to form the second lens over the LED, wherein the step of plasma treating increases adherence of the first lens to the second lens; and
   removing the LED with the first lens and second lens from the second mold.

9. The process of claim 8 wherein the first lens material is the same as the second lens material.

10. The process of claim 8 wherein the first lens contains phosphor.

11. The process of claim 8 wherein plasma treating comprises plasma treating the first lens at between approximately 200-600 Watts to etch the first lens.

* * * * *